United States Patent
Yamazaki

(10) Patent No.: US 9,721,998 B2
(45) Date of Patent: Aug. 1, 2017

(54) DISPLAY DEVICE AND DRIVING METHOD THEREOF

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 210 days.

(21) Appl. No.: 13/654,446

(22) Filed: Oct. 18, 2012

(65) Prior Publication Data

US 2013/0113843 A1    May 9, 2013

(30) Foreign Application Priority Data

Nov. 4, 2011    (JP) ................................. 2011-242020

(51) Int. Cl.
    *G09G 5/10*       (2006.01)
    *H05B 33/06*      (2006.01)
    *H01L 27/32*      (2006.01)

(52) U.S. Cl.
    CPC ........ *H01L 27/3213* (2013.01); *H01L 27/326* (2013.01)

(58) Field of Classification Search
    CPC ... G02F 1/13; H01L 27/3213; H01L 27/3286; H01L 27/3267
    See application file for complete search history.

(56) References Cited

U.S. PATENT DOCUMENTS 6,781,162 B2    8/2004    Yamazaki et al.
6,815,723 B2    11/2004   Yamazaki et al.
(Continued)

FOREIGN PATENT DOCUMENTS

CN    001551701 A    12/2004
CN    101083857 A    12/2007
(Continued)

OTHER PUBLICATIONS

Song, Y. W. et al., "11.3: Distinguished Paper: LTPS-based Transparent AM OLED", *SID 10 Digest*, 2010, pp. 144-147.
(Continued)

*Primary Examiner* — Carolyn R Edwards
*Assistant Examiner* — Krishna Neupane
(74) *Attorney, Agent, or Firm* — Nixon Peabody LLP; Jeffrey L. Costellia

(57) ABSTRACT

Disclosed is a display device including a pixel portion having a plurality of pixels which have a display element and a transmissive portion. The display element includes a light-emitting element which does not transmit external light, while the transmissive portion is arranged to transmit external light. In the display element, a top-emission or bottom-emission type light-emitting element is provided. On the other hand, no light-emitting element or a dual-emission type light-emitting element which possesses an EL layer interposed between two light-transmissive electrodes is provided to the transmissive portion. The emission color of the display element is controlled by a color filter which overlaps with the light-emitting element in the display element, while no color filter is given to the transmissive portion.

29 Claims, 10 Drawing Sheets

(56) References Cited

U.S. PATENT DOCUMENTS

| | | | |
|---|---|---|---|
| 7,030,553 | B2 | 4/2006 | Winters et al. |
| 7,098,069 | B2 | 8/2006 | Yamazaki et al. |
| 7,355,338 | B2 | 4/2008 | Osame et al. |
| 7,399,991 | B2 | 7/2008 | Seo et al. |
| 7,473,928 | B1 | 1/2009 | Yamazaki et al. |
| 7,495,382 | B2 | 2/2009 | Yamazaki et al. |
| 7,609,310 | B2 | 10/2009 | Miyagawa |
| 7,663,149 | B2 | 2/2010 | Seo et al. |
| 8,664,848 | B2 | 3/2014 | Jeong et al. |
| 8,766,533 | B2 | 7/2014 | Kobayashi |
| 9,046,245 | B2 | 6/2015 | Hirakata |
| 2007/0188422 | A1* | 8/2007 | Anazai ............... G06F 1/32 345/76 |
| 2008/0006833 | A1 | 1/2008 | Hirakata |
| 2010/0237374 | A1 | 9/2010 | Chu et al. |
| 2010/0255184 | A1 | 10/2010 | Yamazaki et al. |
| 2011/0001146 | A1* | 1/2011 | Yamazaki et al. ............ 257/79 |
| 2011/0148944 | A1* | 6/2011 | Kobayashi ........... G09G 3/3225 345/690 |
| 2011/0220901 | A1 | 9/2011 | Ha et al. |
| 2011/0273409 | A1* | 11/2011 | Lee ............... H01L 27/326 345/204 |
| 2012/0205676 | A1 | 8/2012 | Seo et al. |
| 2012/0205685 | A1 | 8/2012 | Seo et al. |
| 2012/0205686 | A1 | 8/2012 | Seo et al. |
| 2012/0205701 | A1 | 8/2012 | Sasaki et al. |
| 2014/0252336 | A1 | 9/2014 | Kobayashi |

FOREIGN PATENT DOCUMENTS

| | | |
|---|---|---|
| CN | 102104057 A | 6/2011 |
| CN | 102169886 A | 8/2011 |
| EP | 1478033 A | 11/2004 |
| JP | 2002-324673 | 11/2002 |
| JP | 2007-503093 | 2/2007 |
| JP | 2011-129392 A | 6/2011 |
| JP | 2011-175962 A | 9/2011 |
| TW | 201130372 | 9/2011 |
| WO | WO-2005/020344 | 3/2005 |

OTHER PUBLICATIONS

Chinese Office Action (Application No. 201210411452.X) Dated Jul. 27, 2016.

Taiwanese Office Action (Application No. 101138684) Dated Sep. 10, 2016.

* cited by examiner

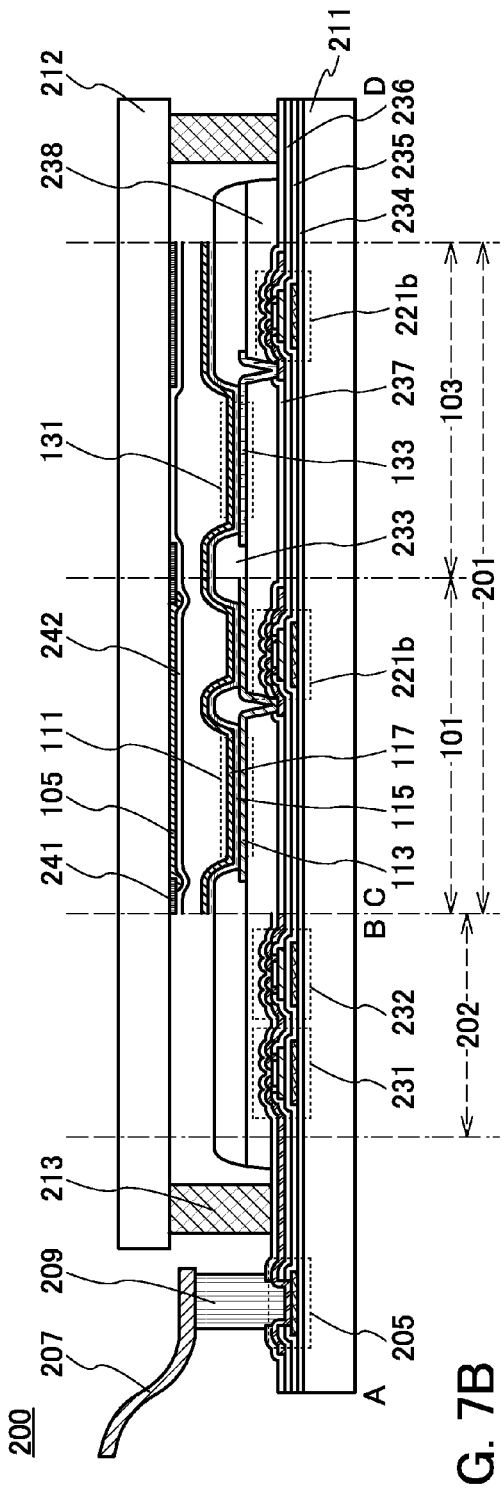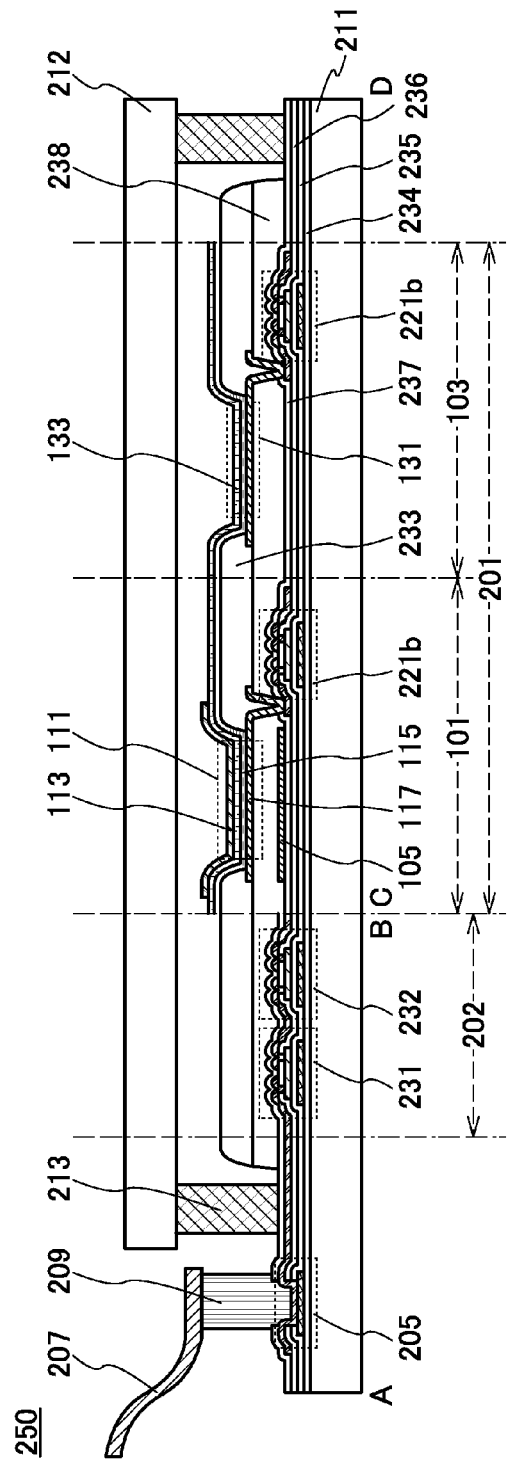

DISPLAY DEVICE AND DRIVING METHOD THEREOF

BACKGROUND OF THE INVENTION

1. Field of the Invention

The present invention relates to a transmissive display device and a method for driving the transmissive display device. In particular, the present invention relates to a transmissive display device including an organic electroluminescence (EL) element and a method for driving the transmissive display device.

2. Description of the Related Art

An organic EL element has been actively researched and developed. In the fundamental structure of the organic EL element, a layer containing a light-emitting organic compound is provided between a pair of electrodes. By applying voltage to this element, light can be emitted from the light-emitting organic compound.

A display device is one of light-emitting devices including an organic EL element. As such a display device, a display device employing a simple matrix mode (also referred to as a passive matrix mode) or an active matrix mode has been known. An organic EL element, which is a self-light-emitting element that can be formed in a film shape, does not need a backlight which is required in a liquid crystal display device and the like, resulting in a thin lightweight high-contrast display device that can be driven with lower power. For example, Patent Document 1 discloses an example of a display device including an organic EL element.

In recent years, various kinds of display devices have been required. As an example, there are display devices having see-through capabilities with which the opposite side of a display portion, which has a light-transmitting property, can be seen. Such display devices having see-through capabilities are expected to have various applications to uses such as windshields on vehicles, windows of architectural structures such as houses and buildings, and glass for show windows and showcases of stores; mobile information terminals such as cellular phones and tablet terminals; wearable displays such as head mounted displays; or head-up displays used for planes and the like.

REFERENCE

[Patent Document 1] Japanese Published Patent Application No. 2002-324673

SUMMARY OF THE INVENTION

In a display device having a see-through capability, improvement in the display quality of images to be displayed has been demanded. However, a clear display image was not able to be obtained because a mixture of light that is transmitted through a display device having a see-through capability (hereinafter referred to as transmitted light) and light emitted from a pixel portion is viewed with conventional devices.

Note that the information terminal device, the wearable display, and the like need to be supplied with electric power for driving by batteries; therefore, a reduction in power consumption of the display device has also been desired in order to lengthen the time during which the display device can be driven.

The present invention is made in view of the foregoing technical background. Therefore, according to one embodiment of the present invention, it is an object to provide a transmissive display device which includes an organic EL element and has improved display quality and a driving method thereof. Another object is to provide a transmissive display device capable of driving with lower power consumption.

One embodiment of the present invention achieves at least one of the above objects.

As a method for improving display quality of a display image, higher luminance of a display element, improvement of color purity, higher definition of a display portion, and the like can be given.

The inventor found that the above problems can be solved by employing a display device structure including a pixel portion having a light-emitting element which does not transmit external light and a transmissive portion which transmits external light. In the light-emitting element of the pixel portion, an electrode having a reflective property is provided as an electrode provided on the side opposite to a viewing side so that external light is blocked. A color filter may be provided so as to overlap with the light-emitting element provided in the pixel portion.

That is, a display device according to one embodiment of the present invention includes first to n-th color filters which selectively transmit any of lights in first to n-th wavelength bands, a plurality of light-emitting elements which overlap with any of the first to n-th color filters and each emit the lights in the first to n-th wavelength bands, and a transmissive portion which transmits visible light. The plurality of light-emitting elements each include a first electrode layer, a second electrode layer, and a layer containing a light-emitting organic compound provided between the first electrode layer and the second electrode layer. Further, the second electrode layer on the color filter side has a light-transmitting property with respect to visible light, and the first electrode layer has a reflective property with respect to visible light.

Since with such a structure, external light is transmitted only through the transmissive portion and not transmitted through a region including the light-emitting element, light emitted from the light-emitting element and transmitted light from external light are not mixed; therefore, a clear display image can be obtained. Further, light emitted from the light-emitting element is viewed through the respective color filters; therefore, color purity can be improved and a clearer display image can be obtained. Therefore, display quality of a transmissive display device can be further improved.

Further, with the above configuration, the structures of light-emitting elements including the pairs of the respective color filters transmitting a different emission color and the respective light-emitting elements (hereinafter a pair including a color filter and a light-emitting element which overlap with each other is defined as a display element) can be the same as each other. Therefore, a distance between light-emitting elements can be reduced as compared with the case where light-emitting elements with different emission colors are formed separately with a metal mask or the like; therefore, definition or an aperture ratio of a display device can be enhanced.

In addition, in the above display device, the second electrode layer preferably has a reflective property in addition to the light-transmitting property with respect to visible light and, in the plurality of light-emitting elements, at least one light-emitting element preferably includes an optical adjustment layer between the first electrode layer and the second electrode layer.

With such a structure, a display element provided with an optical adjustment layer can intensify emission of light in a specific wavelength band by optical interference and color purity of light emitted from the light-emitting element can be further improved. Therefore, a clearer display image can be obtained.

Further, in the above display device, the transmissive portion preferably includes a plurality of transmissive light-emitting elements and, in the plurality of transmissive light-emitting elements, each transmissive light-emitting element preferably includes a third electrode layer, the second electrode layer, and the layer containing a light-emitting organic compound provided between the third electrode layer and the second electrode layer. In the transmissive light-emitting element, the third electrode layer preferably has a light-transmitting property with respect to visible light.

In such a manner, it is preferable that the transmissive portion be provided with a transmissive light-emitting element having a light-transmitting property with respect to visible light. The transmissive light-emitting element includes a light-emitting organic compound which is common to those of the display elements; therefore, when the transmissive light-emitting element and the display elements provided with color filters are driven at the same time to display an image, they can be driven with power lower than power consumed in the case where only the display elements are driven.

Moreover, in the case where the transmissive light-emitting element is driven to display an image, an image can be displayed also on a side which is opposite to a viewing side on which the color filters are provided (also referred to as a rear surface side) by light emitted from the transmissive light-emitting element. A display device formed in such a manner can also be used as a dual emission display device.

Further, an image can also be displayed by driving only the display elements while the transmissive light-emitting element is set to a non-emission state. At this time, because transmitted light is viewed only through the transmissive light-emitting element, the amount of the transmitted light can be increased; therefore, such a driving method is particularly effective in the case where, for example, the background is dark. In the case where an image is not displayed on the rear surface side, the transmissive light-emitting element is set to a non-emission state so that a display image is not viewed from the rear surface side.

In addition, in the above display device, it is preferable that an area occupied by the transmissive light-emitting element be larger than an area occupied by each display element.

Moreover, in the above display device, it is preferable that a total area occupied by the plurality of transmissive light-emitting elements be larger than a total area occupied by the display elements.

As described above, since emission luminance is improved by a reflective electrode which is used as an electrode provided on the side opposite to a viewing side of light-emitting elements, high display quality can be maintained even when the area of a transmissive light-emitting element provided in a transmissive portion is increased. The area of the transmissive light-emitting element is preferably larger because the amount of transmitted light can be increased.

The area of each transmissive light-emitting element can be made larger than the area of each display element, and the total area of the transmissive light-emitting elements can be made larger than the total area of the display elements. For example, in the case where a pixel includes display elements emitting red light, blue light, and green light and a transmissive light-emitting element emitting white light, an area occupied by the transmissive light-emitting element can be made larger than an area occupied by each of the display elements or than a total area occupied by the three display elements.

In a method for driving a display device according to one embodiment of the present invention, the display device at least includes a display element which emits a light in a certain wavelength band and which has a non-light-transmitting property with respect to visible light, and a transmissive light-emitting element which emits the light in the wavelength band and which has a light-transmitting property with respect to visible light. The method for driving the display device switches between a first mode for displaying an image by driving the display element and the transmissive light-emitting element and a second mode for displaying an image by driving only the display element.

In such a manner, for example, in the case where the background is dark or the like, a display element is driven without emitting light from a transmissive light-emitting element so that the amount of transmitted light can be increased, whereas in the case where luminance of the background is high or the like, the transmissive light-emitting element is driven at the same time so that the display device can be driven with lower power consumption. Further, with the use of a transmissive light-emitting element, luminance of a display image can be improved; therefore, a clear image can be displayed even in a bright place.

In a method for driving a display device which is another embodiment of the present invention, the display device at least includes a first display element which emits a light in a first wavelength band and which has a non-light-transmitting property with respect to visible light, a second display element which emits a light in a second wavelength band and which has a non-light-transmitting property with respect to visible light, and a transmissive light-emitting element which emits the light in the first wavelength band and the light in the second wavelength band and which has a light-transmitting property with respect to visible light. The method for driving the display device switches between a first mode for displaying an image by driving the first display element, the second display element, and the transmissive light-emitting element and a second mode for displaying an image by driving the first display element and the second display element while the transmissive light-emitting element is not driven.

In such a manner, driving with lower power consumption can be achieved also in a transmissive display device capable of color display by employing a structure in which a plurality of emission colors are obtained from a plurality of display elements.

Note that in this specification, a display device refers to an image display device provided with a plurality of pixels. In addition, the display device includes any of the following modules in its category: a module in which a connector such as a flexible printed circuit (FPC) or a tape carrier package (TCP) is attached to a display device; a module having a TCP provided with a printed wiring board at the end thereof; and a module having an integrated circuit (IC) directly mounted by a chip on glass (COG) method on a substrate over which a pixel is formed.

According to the present invention, a transmissive display device which includes an organic EL element and has improved display quality and a driving method thereof can be provided. In addition, a transmissive display device capable of driving with low power consumption can be provided.

BRIEF DESCRIPTION OF THE DRAWINGS

FIGS. 7A and 7B illustrate a display device according to one embodiment of the present invention.

DETAILED DESCRIPTION OF THE INVENTION

Figure 1A:
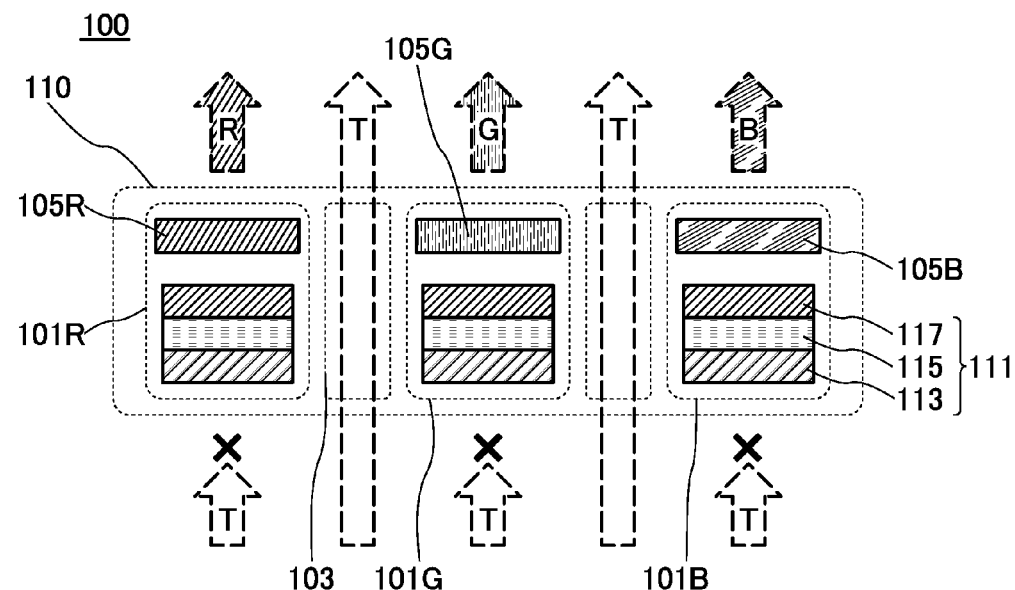
FIGS. 1A and 1B each illustrate a display device according to one embodiment of the present invention.

Embodiments of the present invention are described with reference to the accompanying drawings. Note that the present invention is not limited to the following description and it will be easily understood by those skilled in the art that various changes and modifications can be made without departing from the spirit and scope of the present invention. Therefore, the present invention should not be construed as being limited to the description in the following embodiments. Note that in structures of the present invention described below, the same portions or portions having similar functions are denoted by the same reference numerals in different drawings, and description thereof is not repeated.

Note that in each drawing described in this specification, the size, the layer thickness, or the region of each component is exaggerated for clarity in some cases. Therefore, embodiments of the present invention are not limited to such scales.

Embodiment 1

A structure example of a display device according to one embodiment of the present invention will be described with reference to FIGS. 1A and 1B, FIGS. 2A and 2B, FIGS. 3A to 3C, and FIGS. 4A to 4C.
<Structure Example>

FIG. 1A is a schematic diagram of a display device 100.

The display device 100 includes a plurality of pixels 110, and each pixel 110 includes a display element 101R emitting red light, a display element 101G emitting green light, a display element 101B emitting blue light, and a transmissive portion 103. Here, in the case where characteristics common to the display elements are described, these display elements are collectively referred to as a display element 101.

The display element 101R includes a light-emitting element 111 and a color filter 105R. Similarly, the display element 101G includes a light-emitting element 111 and a color filter 105G, and the display element 101B includes a light-emitting element 111 and a color filter 105B.

Here, in the display device 100, the side on which the color filters are provided is a viewing side on which a display image and transmitted light are visible. The side opposite to the viewing side is referred to as a rear surface side.

In the light-emitting element 111, an EL layer 115 and a second electrode layer 117 are sequentially stacked over a first electrode layer 113. Here, the second electrode layer 117 provided on the color filter side has a light-transmitting property with respect to visible light. The first electrode layer 113 provided on the side opposite to the color filter has a reflective property with respect to visible light. Therefore, light is emitted from the light-emitting element 111 toward the color filter side. Since the first electrode layer 113 has a reflective property, light emitted from the EL layer 115 to the first electrode layer 113 side is reflected and can be emitted to the second electrode layer 117 side; therefore, light emission intensity of the light-emitting element 111 can be intensified if the optical interference effect is utilized. Note that a specific structure example of the light-emitting element 111 will be described in an embodiment below.

The color filter 105R provided in the display element 101R selectively transmits light in a red wavelength band. The color filter 105G provided in the display element 101G selectively transmits light in a green wavelength band. The color filter 105B provided in the display element 101B selectively transmits light in a blue wavelength band.

Light emission from the light-emitting element 111 includes at least light in a red wavelength band, light in a green wavelength band, and light in a blue wavelength band. The light-emitting element 111 is preferably a light-emitting element emitting white light. Therefore, light R emitted from the display element 101R through the color filter 105R is red light. Similarly, light G emitted from the display element 101G through the color filter 105G is green light, and light B emitted from the display element 101B through the color filter 105B is blue light.

In such a manner, the display device 100 can be a full-color display device when each pixel 110 is provided with display elements emitting red light, green light, and blue light.

The transmissive portion 103 is a region which transmits visible light. The display device 100 transmits transmitted light T through the transmissive portion 103.

On the other hand, in a region where the display element 101 is provided, the transmitted light T is reflected by the first electrode layer 113 and is not transmitted. Note that an anti-reflection layer may be provided on the rear surface side of the first electrode layer 113 so that the transmitted light T is not reflected.

In the pixel 110, the transmitted light T is transmitted through the region where the transmissive portion 103 is provided and is reflected by the first electrode layer 113 and not transmitted through the region where the display element 101 is provided. Therefore, light emitted from each light-emitting element and transmitted light from external light are not mixed and a clear display image can be obtained.

Further, light is emitted from the light-emitting element 111 through the color filter; therefore, color purity of light emitted from the display element 101 can be improved and a clearer display image can be obtained.

Since the display element 101 transmits by the color filter light in a certain wavelength band, which is emitted from the light-emitting element 111, the light-emitting element 111 provided in each display element 101 can have a common structure. Therefore, a step of separately forming light-emitting elements in the respective display elements can be omitted, and manufacturing yield can be improved. Further, a distance between adjacent light-emitting elements can be reduced as compared with the case where light-emitting elements are formed separately with a metal mask or the like; therefore, definition or an aperture ratio of the display device 100 can be enhanced.

With the display device 100 having such a structure, a transmissive display device which has improved display quality can be obtained.

Here, a light-emitting element having a light-transmitting property can be provided in the transmissive portion 103. A structure example of a display device in which a transmissive light-emitting element is provided in a transmissive portion 103 will be described below. Note that description of portions common to those described above will be omitted or simply given.

Figure 1B:
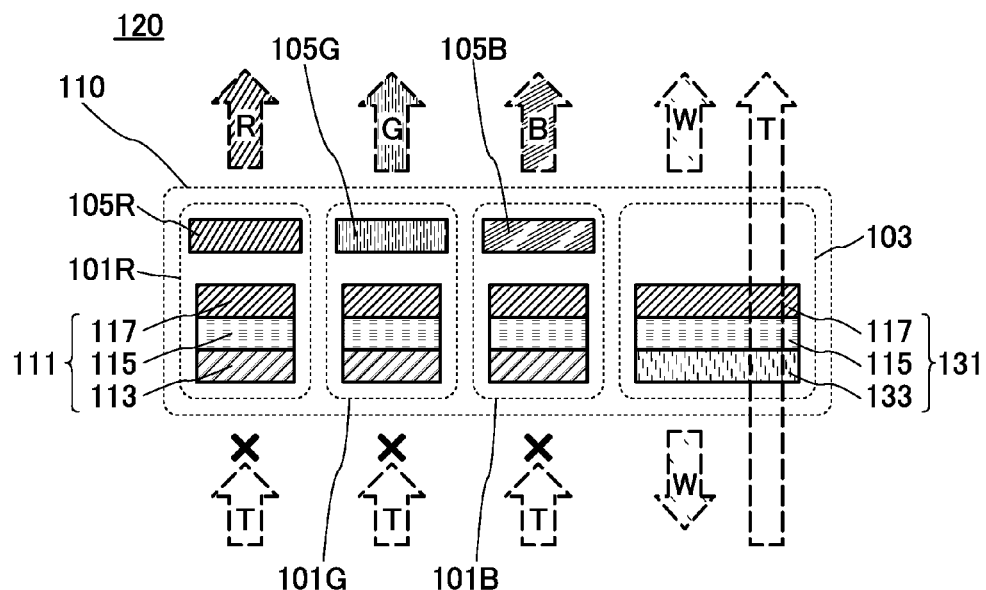

FIG. 1B is a schematic diagram of a display device 120.

The display device 120 includes a plurality of pixels 110, and each pixel 110 includes display elements 101R, 101G, and 101B and a transmissive portion 103. Here, the structure of the display device 120 is similar to that of the display device 100 except for the structure of the transmissive portion 103.

The transmissive portion 103 is provided with a transmissive light-emitting element 131. In the transmissive light-emitting element 131, an EL layer 115 and a second electrode layer 117 are sequentially stacked over a third electrode layer 133.

The EL layer 115 and the second electrode layer 117 included in the transmissive light-emitting element 131 are formed using the same layer as the EL layer 115 and the same layer as the second electrode layer 117 of the light-emitting element 111, respectively. The third electrode layer 133 has a light-transmitting property with respect to visible light.

Therefore, light emission W from the transmissive light-emitting element 131 is light emission including at least light in a red wavelength band, light in a green wavelength band, and light in a blue wavelength band, and is preferably white light emission. In addition, since both the third electrode layer 133 and the second electrode layer 117 have light-transmitting properties, light is emitted from the transmissive light-emitting element 131 toward both the viewing side and the rear surface side.

Further, since both the third electrode layer 133 and the second electrode layer 117 of the transmissive light-emitting element 131 have light-transmitting properties, the transmissive light-emitting element 131 transmits light. Therefore, in the transmissive portion 103, light transmitted through a region where the transmissive light-emitting element 131 is provided and light transmitted through the other regions are viewed from the viewing side as transmitted light T.

In such a manner, the transmissive light-emitting element 131 can be formed easily because the structure thereof can be the same as that of the light-emitting element 111 except for the third electrode layer 133. In addition, at the time of displaying an image, when each display element and the transmissive light-emitting element 131 are driven at the same time to display an image, they can be driven with power lower than power consumed in the case where only the display elements are driven.

With such a structure, the display device 120 functions as a full-color display device on the viewing side and as a display device of monochromatic (white) light emission on the rear surface side and thus can also be used as a dual emission display device.

Further, when an image is displayed by driving only the display elements 101 while the transmissive light-emitting element 131 is set to a non-emission state, only transmitted light is viewed through the transmissive light-emitting element 131 and the amount of the transmitted light T can be increased. Such a driving method is particularly effective in the case where, for example, the background is dark. In the case where an image is not displayed on the rear surface side or the like, such a driving method can also be employed.

In such a manner, a driving method can be controlled depending on luminance of the background or usage. Power consumption can be reduced by controlling a driving method in such a manner depending on a situation.

Note that although one or more transmissive portions 103 are provided in each pixel in this embodiment, a pixel with a transmissive portion 103 and a pixel without a transmissive portion 103 may be combined. Alternatively, a structure in which a transmissive portion 103 shared by different pixels is provided may be employed. For example, one transmissive portion 103 may be shared between adjacent pixels. Note that in the case where the transmissive portion 103 is provided with the transmissive light-emitting element 131, one or more transmissive light-emitting elements 131 are preferably provided in a pixel.

Although the pixel includes three display elements emitting three lights including red light, green light, and blue light in this embodiment, the structure of the pixel is not limited thereto and a structure including one or more display elements can be employed.

In the case of providing one display element in a pixel, a structure in which a light-emitting element thereof emits light in a certain wavelength band may be employed and a color filter which selectively transmits the light may be provided. The display device with such a structure can be used as a display device of a monochromatic color whose color purity is improved. In addition, in the case where a transmissive portion is provided with a transmissive light-emitting element at this time, an image can be displayed on both the viewing side and the rear surface side by using the light of the wavelength band.

In the case of providing two or more display elements in a pixel, in a manner similar to that of the above display device, a structure in which light-emitting elements thereof each emit lights in a plurality of wavelength bands may be employed, and color filters which selectively transmit one of lights in the plurality of wavelength bands may be provided for each display element. In addition, in the case where a transmissive portion is provided with a transmissive light-emitting element at this time, the transmissive light-emitting element emits the lights in the plurality of wavelength bands on the viewing side and the rear surface side.

Here, it is preferable that an optical adjustment layer be provided between electrodes of a light-emitting element in a display element, which face each other, and emission intensity be increased by a microcavity (micro-resonance) effect. Color purity of the light emitted from the display element including the light-emitting element provided with the optical adjustment layer can be improved; therefore, display quality of the display device can be further improved.

Figure 2A:
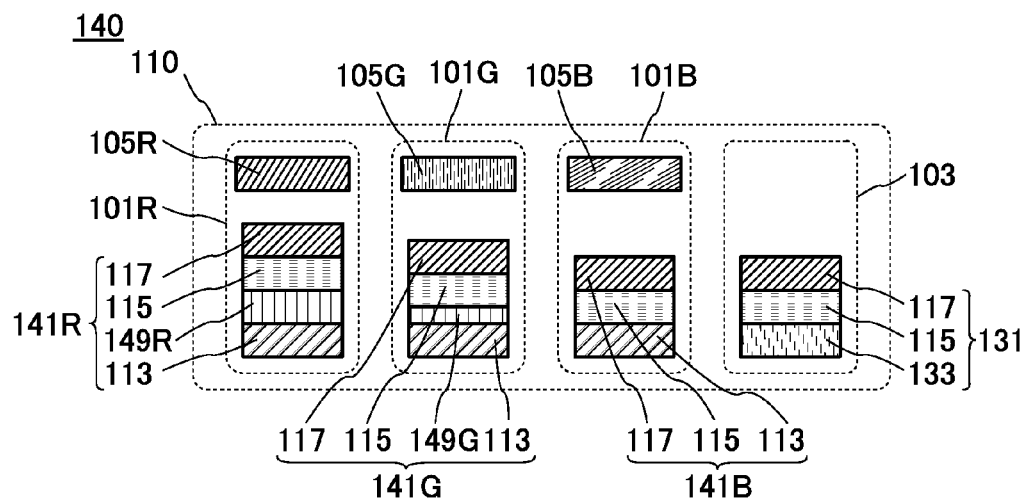
FIGS. 2A and 2B each illustrate a display device according to one embodiment of the present invention.

FIG. 2A is a schematic diagram of a display device 140 using an optical adjustment layer.

The display device 140 differs from the display device 120 illustrated in FIG. 1B in the structures of display elements 101R, 101G, and 101B.

A second electrode layer 117 on the viewing side of each light-emitting element in the display element 101 and the transmissive portion 103 has both a light-transmitting property and a reflective property with respect to visible light. Therefore, part of visible light reaching the second electrode layer 117 is transmitted and the other part of the visible light is reflected.

Therefore, in a light-emitting element provided with the first electrode layer 113 which does not have a light-transmitting property but has a reflective property with respect to visible light, an optical distance between the first electrode layer 113 and the second electrode layer 117 is adjusted so that emission intensity can be intensified and color purity can be improved by a microcavity effect.

In a light-emitting element 141B in the display element 101B emitting blue light, an optical distance between the first electrode layer 113 and the second electrode layer 117 is optimized without the use of the optical adjustment layer so that a light in a blue wavelength band is intensified.

In a light-emitting element 141R in the display element 101R emitting red light, an optical adjustment layer 149R for adjusting an optical distance is provided between the first electrode layer 113 and the second electrode layer 117 so that a light in a red wavelength band is intensified. The optical adjustment layer 149R is formed using a material that transmits visible light.

In a light-emitting element 141G in the display element 101G emitting green light, an optical adjustment layer 149G for adjusting an optical distance is provided between the first electrode layer 113 and the second electrode layer 117 so that a light in a green wavelength band is intensified. The optical adjustment layer 149G is similarly formed using a material that transmits visible light.

Note that although the structure in which the optical adjustment layers 149R and 149G are each provided between the EL layer 115 and the first electrode layer 113 is illustrated in FIG. 2A, without limitation thereon, the optical adjustment layers 149R and 149G may each be provided at any position between the first electrode layer 113 and the second electrode layer 117. Alternatively, two or more optical adjustment layers may be provided between the electrode layers.

Here, the optical adjustment layer can also be formed using the same layer as the third electrode layer 133 having a light-transmitting property included in the transmissive light-emitting element in the transmissive portion 103. The optical adjustment layer and the third electrode layer 133 are preferably formed in the same layer because the manufacturing process can be simplified.

Figure 2B:
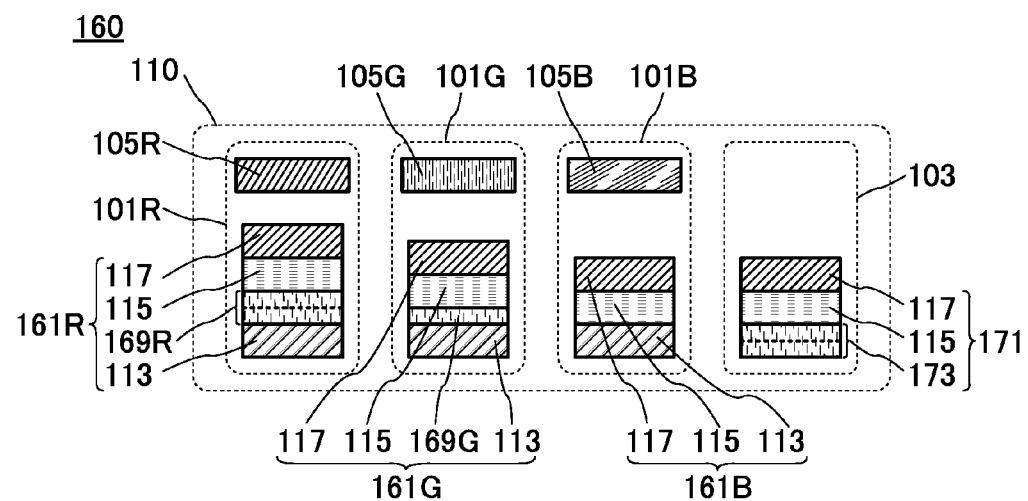

FIG. 2B is a schematic diagram of a display device 160.

The display device 160 differs from the above display device 140 in the structures of an optical adjustment layer and a third electrode layer.

A transmissive light-emitting element 171 provided in a transmissive portion 103 includes a third electrode layer 173 in which conductive layers including a light-transmitting conductive material are stacked. Each layer of the third electrode layer 173 is preferably formed using the same material. At this time, the interface between the stacked layers is not clear in some cases.

A light-emitting element 161R in a display element 101R emitting red light includes an optical adjustment layer 169R. The optical adjustment layer 169R is formed using the same stacked conductive layers as the third electrode layer 173.

A light-emitting element 161G in a display element 101G emitting green light includes an optical adjustment layer 169G. The optical adjustment layer 169G is formed using any of the conductive layers of the third electrode layer 173.

Since the optical adjustment layers 169R and 169G are formed using the conductive layers including a light-transmitting conductive material, light emission intensity can be increased in a manner similar to that of the display device 140. Furthermore, color purity of the light emitted from the display element 101 can be improved; therefore, display quality of the display device is improved.

<Arrangement Example of Display Element and Transmissive Portion>

An arrangement example of display elements and a transmissive portion which are included in a pixel will be described below.

FIGS. 3A to 3C and FIGS. 4A to 4C are top schematic views each illustrating an arrangement example of a pixel. FIGS. 3A to 3C and FIGS. 4A to 4C illustrate at least a region including one pixel.

Figure 3A:
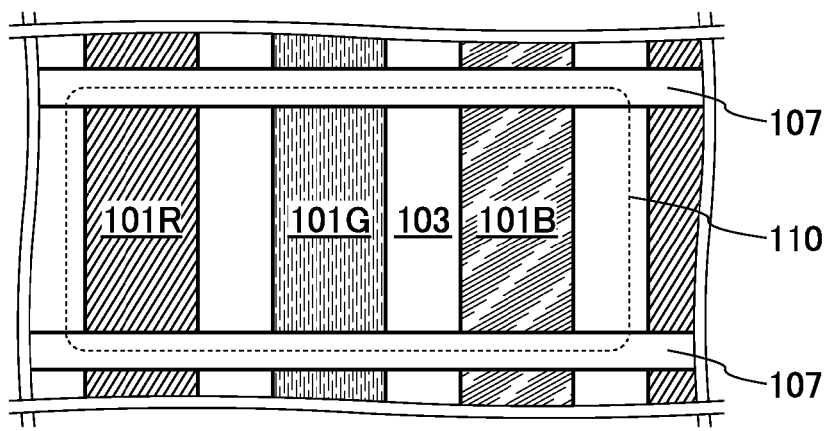
FIGS. 3A to 3C are top views each illustrating an arrangement example of display elements and a transmissive portion according to one embodiment of the present invention.

In an arrangement example in FIG. 3A, the display elements 101R, 101G, and 101B are arranged in a stripe form in the longitudinal direction. The transmissive portion 103 is provided between the adjacent display elements.

Here, in FIG. 3A, a wiring and the like is provided between the display elements of the same color (e.g., between the two display elements 101R) as a non-transmissive portion 107 which does not transmit light. Note that in the case where a light-transmitting material is used as a wiring material, it is not necessary to form the non-transmissive portion 107, and a display device whose aperture ratio is extremely high can be obtained.

Figure 3B:
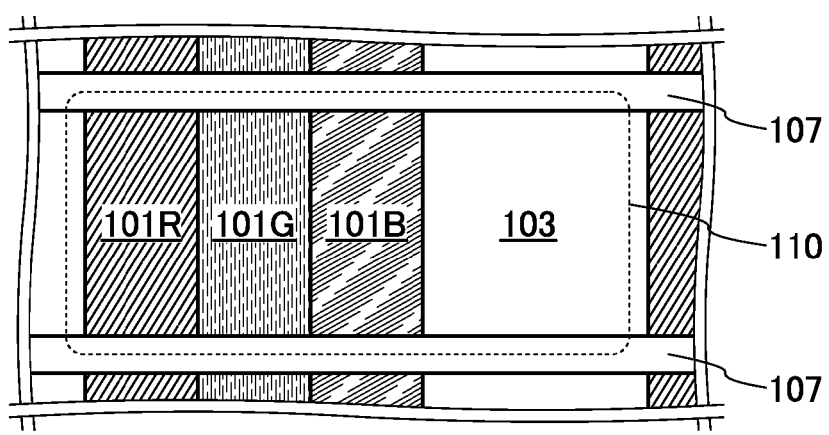

In an arrangement example in FIG. 3B, similarly to the arrangement shown in FIG. 3A, the display elements 101R, 101G, and 101B and the transmissive portion 103 are arranged in a stripe form in the longitudinal direction. However, each of the pixels is provided with only one non-transmissive portion 107.

Figure 3C:
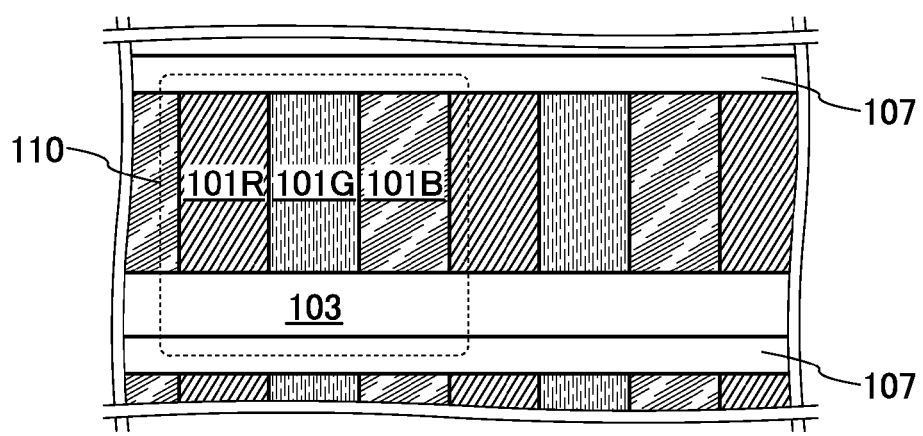

In an arrangement example in FIG. 3C, the transmissive portion 103 is provided in a stripe form in the horizontal direction.

In such a manner, when the plurality of display elements 101 emitting light of the same color are provided in a stripe form, a color filter included in the display element 101 can be successively provided in one direction.

Alternatively, the transmissive portion 103 can be surrounded with the display elements.

Figure 4A:
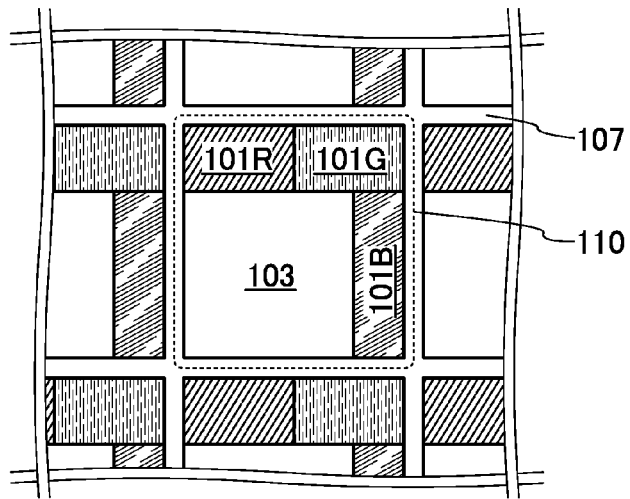
FIGS. 4A to 4C are top views each illustrating an arrangement example of display elements and a transmissive portion according to one embodiment of the present invention.

In the structure of FIG. 4A, the display elements 101R, 101G, and 101B are arranged so that the transmissive portion 103 in one pixel 110 is surrounded by the display elements in the pixel and its adjacent two pixels. The pixels 110 are arranged in a grid form.

Figure 4B:
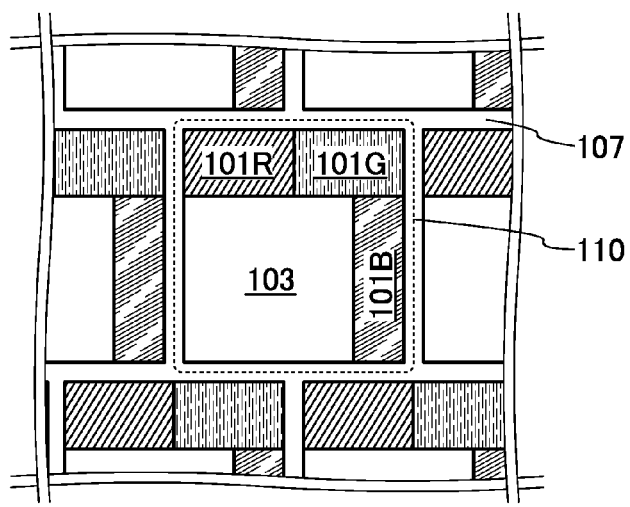

In the structure of FIG. 4B, the pixels 110 which are similar to those of FIG. 4A are alternately misaligned in the vertical direction.

Figure 4C:
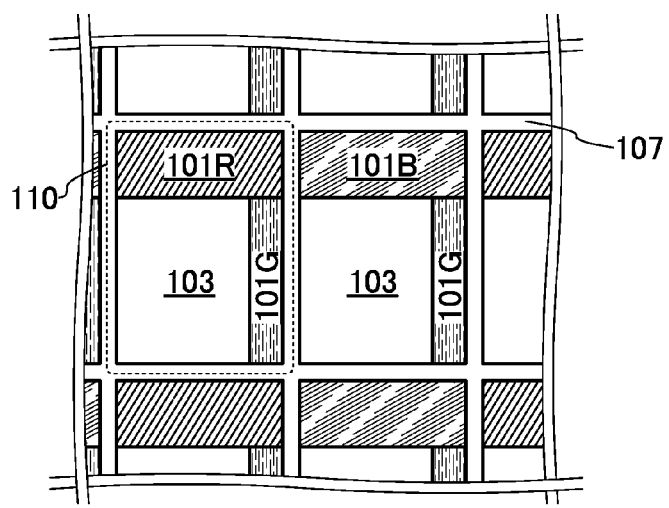

In the structure of FIG. 4C, the pixel 110 includes one transmissive portion 103 and any two display elements of the three kinds of display elements. The adjacent pixel 110 includes the other display element of the three kinds of display elements. Full-color display can be obtained by these two kinds of pixels 110.

In the case where the transmissive portions 103 are arranged in a stripe form at regular intervals as shown in FIGS. 3A to 3C for example, transmitted light is diffracted and therefore linear unevenness might be viewed in some cases depending on the width of the intervals. As illustrated in FIGS. 4A to 4C, the transmissive portion 103 is preferably surrounded with the display elements because such linear unevenness due to light diffraction can be suppressed.

Note that in the arrangement examples given above, the area of each display element can be adjusted as appropriate depending on characteristics of a light-emitting element provided in each display element, such as luminance or light emission efficiency. In a similar manner, the area of the transmissive portion can be adjusted as appropriate depending on an aperture ratio (transmittance) which is demanded in accordance with transmissivity in the transmissive portion. In addition, it is needless to say that arrangement order, positional relation, or the like of the display elements in the pixel can be changed as appropriate.

This embodiment can be combined with any of the other embodiments disclosed in this specification as appropriate.

Embodiment 2

In this embodiment, a structure example of a display device including a transmissive light-emitting element in a transmissive portion will be described with reference to drawings.

The transmissive display device according to one embodiment of the present invention can employ either a simple matrix mode or an active matrix mode. An example of display device employing an active matrix mode will be described below.

Figure 5A:
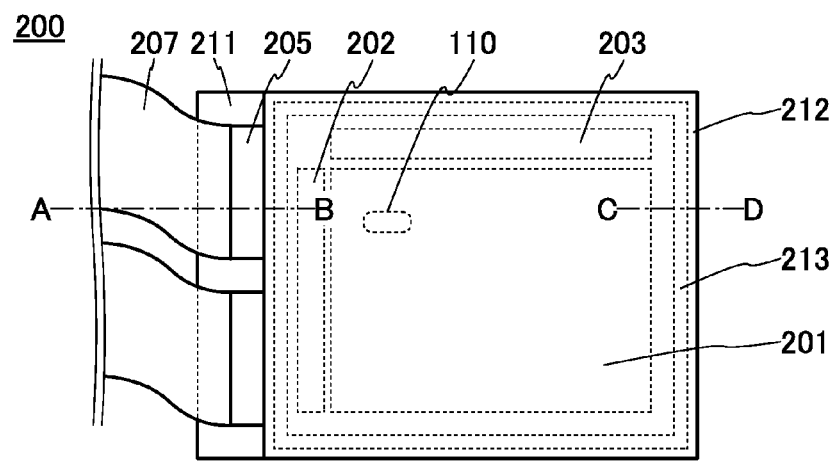
FIGS. 5A and 5B illustrate a display device according to one embodiment of the present invention.

FIG. 5A is a schematic top view of a display device 200 according to one embodiment of the present invention.

The display device 200 includes a first substrate 211 and a second substrate 212 which face each other. Over the first substrate 211, a display portion 201 including a plurality of pixels 110, a scan line driver circuit 202, and a signal line driver circuit 203 are provided. The first substrate 211 and the second substrate 212 are attached to each other with a sealant 213 surrounding the display portion 201, and a sealed region surrounded by the first substrate 211, the second substrate 212, and the sealant 213 is formed. A wiring for electrically connecting the scan line driver circuit 202 and the signal line driver circuit 203 to an external input terminal 205 provided outside the sealed region is extended from the inside to the outside of the sealed region. Further, a power source potential and a signal such as a driving signal, which drive the scan line driver circuit 202, the signal line driver circuit 203, and the like, can be input through an FPC 207 which is electrically connected to the external input terminal 205.

As the pixels 110 provided in the display portion 201, any of the pixels described in Embodiment 1 as examples can be used. The first substrate 211 and the second substrate 212 have light-transmitting properties with respect to visible light. Therefore, the display device 200 is a transmissive display device capable of transmitting light through the transmissive portion 103 in the pixel 110.

<Structure Example of Display Portion>

A structure example of the display portion 201 will be described below.

Structure Example 1

In this structure example, an example of a structure of a display portion will be described in which a display element provided in the pixel includes a top-emission type light-emitting element that emits light toward the side opposite to the first substrate over which a display element provided in the pixel is provided.

Figure 5B:
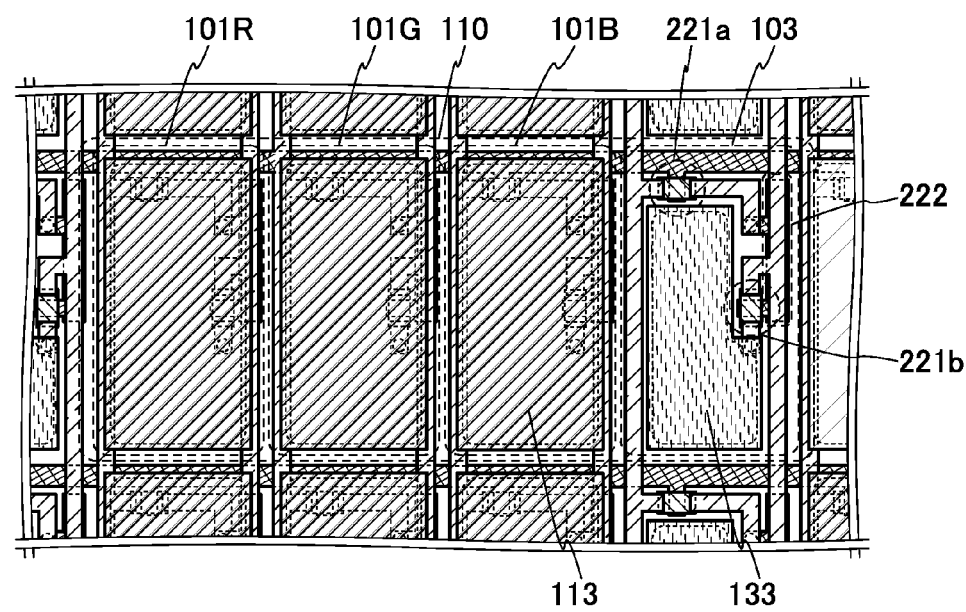

FIG. 5B is a schematic top view of a region including one pixel 110 in the display portion 201. Note that the EL layer 115, the second electrode layer 117, and the like are not illustrated in FIG. 5B for simplicity.

The pixel 110 includes the display elements 101R, 101G, and 101B and the transmissive portion 103. The light-emitting element provided in the display element 101 is a top-emission type light-emitting element that emits light toward the side opposite to the first substrate 211. The transmissive portion 103 is provided with a transmissive light-emitting element. Here, the display element 101 includes the first electrode layer 113 having a reflective property with respect to visible light. The transmissive light-emitting element includes the third electrode layer 133 having a light-transmitting property with respect to visible light.

Although not illustrated here, the EL layer 115 covering the first electrode layer 113 or the third electrode layer 133, and the second electrode layer 117 covering the EL layer 115 are at least provided. In addition, a region of the second substrate 212, which is overlapped with the first electrode layer 113, is provided with a color filter.

The display element 101 and the transmissive portion 103 each include a switching transistor 221a, a driver transistor 221b, and a capacitor 222. A gate of the transistor 221a is electrically connected to the scan line driver circuit 202, one of a source and a drain of the transistor 221a is electrically connected to the signal line driver circuit 203, and the other of the source and the drain of the transistor 221a is electrically connected to a gate of the transistor 221b. One of a source and a drain of the transistor 221b is electrically connected to the signal line driver circuit 203, and the other of the source and the drain of the transistor 221b is electrically connected to the first electrode layer 113 or the third electrode layer 133. The capacitor 222 is formed in a region where a conductive layer electrically connected to the other of the source and the drain of the transistor 221a is overlapped with a conductive layer electrically connected to the one of the source and the drain of the transistor 221b with an insulating layer provided between the conductive layers. Note that although the structure in which two transistors and one capacitor are included in each of the display element 101 and the transmissive portion 103 is illustrated here, without limitation thereon, one or more transistor and one or more capacitor may be included therein. In addition, a functional element other than the transistor and the capacitor (e.g., a diode element or a resistor) may be provided.

The pixel 110 is provided with three wirings in total: a wiring electrically connected to the gate of the transistor 221a, a wiring electrically connected to the one of the source and the drain of the transistor 221a, and a wiring electrically connected to the one of the source and the drain of the transistor 221b. Note that the number of these wirings can be changed as appropriate depending on the circuit configuration of the display elements and the transmissive portion or the number or kind of signals for driving the display elements and the transmissive portion.

The light-emitting element in the display element 101 in this structure example is a top-emission type light-emitting element that emits light toward the side opposite to the first substrate 211 over which the display element 101 is provided. Therefore, the first electrode layer 113 in the display element 101 can be formed so as to partly cover the transistor 221a, the transistor 221b, the capacitor 222, and the above wirings, whereby a light emission area can be increased.

For the transmissive portion 103, a dual-emission type transmissive light-emitting element which emits light toward both the first substrate 211 side and the second substrate 212 side is used. Here, the third electrode layer 133 provided in the transmissive portion 103 may be formed so as to partly cover the transistor 221a, the transistor 221b, the capacitor 222, and the above wirings, thereby forming a light emission area; however, light emission toward the rear surface side might be partly blocked in such a case. Therefore, FIG. 5B illustrates a structure in which the third electrode layer 133 is provided so as not to overlap with the transistors and the wirings. Such a structure is preferably employed, for example, in the case where elements such as the transistors and the capacitor might be affected by deterioration or variation in characteristics due to light irradiation. On the other hand, in the case where there is no such influence by light irradiation, the third electrode layer 133 may cover the transistors, the capacitor, and the wirings as in the case of the display element 101, and a light emission area in which light is emitted toward the second substrate 212 side can be increased in such a case.

Note that although, in this structure example, the transistors provided in the display element 101 and the transmissive portion 103 are of the same type, the transistors may be different from each other in accordance with characteristics of the light-emitting elements or the transmissive light-emitting element. Specifically, it is particularly effective to optimize the size of each of the driver transistors 221b (the gate length or gate width).

With the structure which is described in this structure example, a transmissive display device in which a top-emission type light-emitting element is provided for each display element can be achieved.

Structure Example 2

In this structure example, an example of a structure of a display portion will be described in which a display element provided in the pixel includes a bottom-emission type light-emitting element that emits light toward the first substrate side where the display element is provided. Note that description of portions which are already described in Structure Example 1 will be omitted or simply given.

Figure 6A:
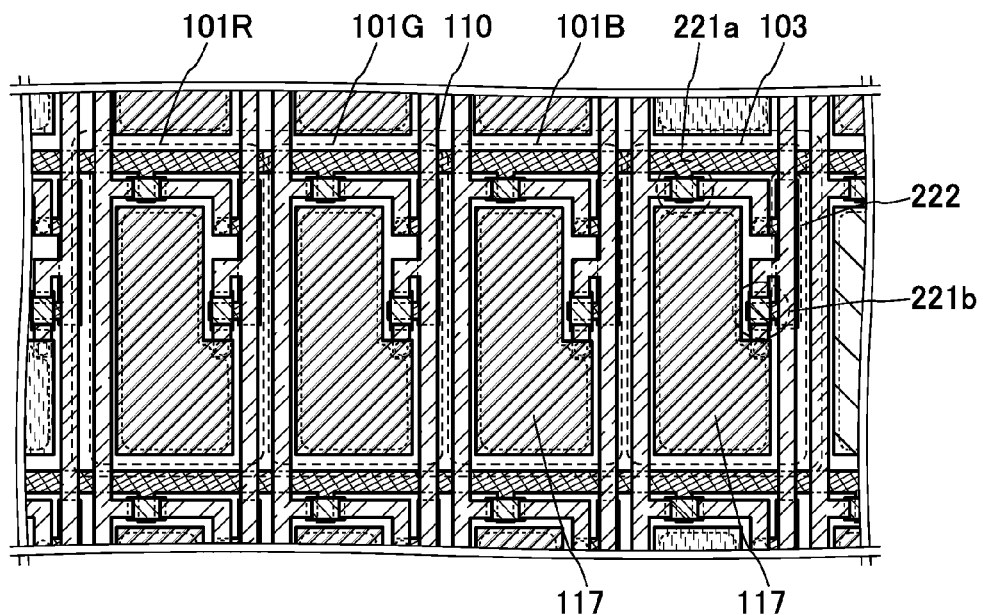
FIGS. 6A and 6B illustrate a display device according to one embodiment of the present invention.

FIG. 6A is a schematic top view of a region including a pixel 110. The pixel 110 which will be described in this structure example as an example is different from that in Structure Example 1 in the structures of the electrode layers in the display element 101 and the transmissive portion 103.

The display element 101 and the transmissive portion 103 are each provided with the second electrode layer 117 having a light-transmitting property (or both of a light-transmitting property and a reflective property) with respect to visible light.

Although not illustrated here, the EL layer 115 covering the second electrode layer 117 is provided. Further, the first electrode layer 113 having a reflective property but not having a light-transmitting property with respect to visible light is provided in a region in the display element 101, which is overlapped with the second electrode layer 117, and the third electrode layer 133 having a light-transmitting property with respect to visible light is provided in a region in the transmissive portion 103, which is overlapped with the second electrode layer 117.

Therefore, the light-emitting element in the display element 101 is a bottom-emission type light-emitting element that emits light toward the first substrate 211 side. The transmissive light-emitting element in the transmissive portion 103 is a dual-emission type light-emitting element which transmits visible light and emits light toward both the first substrate 211 side and the second substrate 212 side.

Furthermore, in the display element 101, a color filter is provided below the second electrode layer 117 (on the side opposite to the EL layer 115) in a region which is overlapped with the second electrode layer 117.

With such a structure, a transmissive display device in which a bottom-emission type light-emitting element is provided for each display element can be achieved.

Structure Example 3

The above structure examples shows a structure in which each of the display elements and the transmissive portion have almost the same area; however, it is preferable to increase the area of the transmissive portion by having different structures of the light-emitting element and the transmissive light-emitting element. A structure example where the area of the transmissive portion is made larger than that of each display element will be described below.

Figure 6B:
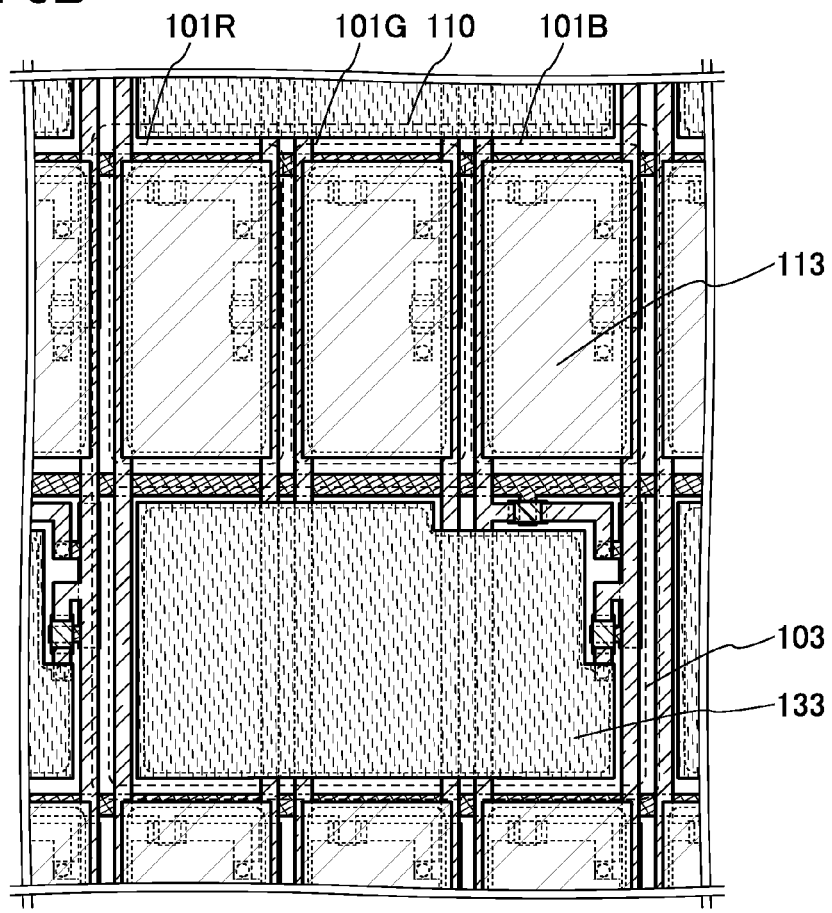

FIG. 6B is a schematic top view of a region including a pixel 110. The pixel 110 which will be described in this structure example as an example is different from that in Structure Example 1 in the area occupied by one pixel 110 and the shape of the transmissive portion 103.

Here, the pixel 110 is divided into two rows: three display elements (the display elements 101R, 101G, and 101B) are arranged in one row, and the other row is occupied by one transmissive portion 103.

The third electrode layer 133 in the transmissive portion 103 is formed so as to cross part of a wiring provided therebelow. Here, in a region where the third electrode layer 133 and the wiring are overlapped with each other, transmitted light and light emitted from the transmissive light-emitting element toward the rear surface side are shielded; however, this is not problematic because an area not overlapped with the wiring is sufficiently larger than an area overlapped therewith. Note that a region overlapped with the third electrode layer 133 may be provided with a wiring having a light-transmitting property.

In such a manner, when the area of the transmissive portion 103 is increased, a display device whose transparency is high can be obtained. It is preferable to make larger an area occupied by the transmissive light-emitting element in the transmissive portion 103 than an area occupied by one of the display elements 101. Further, when the area occupied by the transmissive light-emitting element is made larger than the total area occupied by the all the display elements 101 included in one pixel, in other words, when the total area occupied by all the transmissive light-emitting elements is larger than the total area occupied by all the display elements in an entire display device, a display device whose transparency is much higher can be obtained, which is preferable.

Although, in this structure example, a structure in which one pixel is evenly divided into two rows to arrange the display elements and the transmissive portion is shown, without limitation thereon, the width of each row and column can be changed as appropriate. For example, in FIG. 6B, the pixel can be configured to increase the area occupied by the transmissive portion 103 in such a manner that the longitudinal length of the transmissive portion 103 is made longer than that of the display element 101.

In each of the pixels which are periodically arranged, one display element 101 and one transmissive portion 103 are at least provided, and the shapes, occupation areas, and arrangement manners of the display element 101 and the transmissive portion 103 in the pixel are not limited to those described in the above structure examples.

The above is the description of the display portion having the pixels each using the transmissive light-emitting element.

Note that in the case of a display device employing a simple matrix (passive matrix) mode, a structure without a transistor can be employed. For example, two wirings electrically connected to each pair of electrodes in a display element and a transmissive light-emitting element may be arranged periodically. In the case where a capacitor is provided, it is preferable to form a capacitor with two conductive layers in the same layers as the above two wirings.

<Cross-Sectional Structure Example of Display Device>

The display device according to one embodiment of the present invention will be described below in detail by giving an example of the cross-sectional structure.

Structure Example 1

FIG. 7A is a schematic cross-sectional view of the display device 200 taken along the lines A-B and C-D in a region illustrated in FIG. 5A, which includes the external input terminal 205, the scan line driver circuit 202, and the display portion 201. In this structure example, an example in the case where a top-emission type light-emitting element is used for the display element will be described.

As a substrate used for the first substrate 211 and the second substrate 212, a material having a light-transmitting property with respect to visible light can be used. For example, glass, quartz, or the like can be used. Alternatively, for example, a resin material having a light-transmitting property such as an acrylic resin can be used as long as it can withstand heat treatment in a manufacturing process. In addition, the display device can have flexibility with the use of extremely thin glass, a flexible resin, or the like for the substrates.

It is preferable that the first substrate 211 over which the light-emitting element and the transistor are formed be heated in advance to a temperature enough to high to shrink the substrate and impurities such as water, hydrogen, and oxygen adsorbed in the substrate or the surface thereof be reduced. By the heat treatment, diffusion of the impurities during the manufacturing process of the light-emitting element and the transistor is suppressed and a highly reliable display device can be obtained.

The external input terminal 205 is formed using a conductive layer included in transistors or a light-emitting element in the display device 200. In this structure example, the external input terminal 205 includes a stack of a conductive layer used as gates of the transistors and a conductive layer used as source and drain electrodes of the transistors. It is preferable that the external input terminal 205 thus include a stack of a plurality of conductive layers because it increases mechanical strength against a pressure bonding step performed on the FPC 207. A connector 209 is provided in contact with the external input terminal 205, and the FPC 207 is electrically connected to the external input terminal 205 through the connector 209. The connector 209 can be formed using a paste-form or sheet-form material that is obtained by mixing metal particles into a thermosetting resin and that exhibits anisotropic conductivity by thermocompression bonding. As the metal particles, particles in which two or more kinds of metals are layered, for example, Ni particles coated with Au are preferably used.

In FIG. 7A, the scan line driver circuit 202 includes a circuit in which transistors 231 and 232 which are n-channel transistors are used in combination, as an example. Note that the structure of the scan line driver circuit 202 is not limited thereto, and various CMOS circuits in which an n-channel transistor and a p-channel transistor are used in combination, a circuit composed of a p-channel transistor, or the like may be included in the scan line driver circuit 202. Note that the same applies to the signal line driver circuit 203. Although this structure example shows a driver-integrated structure in which the scan line driver circuit 202 and the signal line driver circuit 203 are formed over the substrate over which the display portion 201 is formed, the scan line driver circuit 202 or the signal line driver circuit 203, or both may be formed over a substrate different from that over which the display portion 201 is formed.

Note that there is no particular limitation on the structures of transistors included in the display portion 201, the scan line driver circuit 202, and the signal line driver circuit 203. For example, a forward staggered transistor or an inverted staggered transistor may be used. Further, a top-gate transistor or a bottom-gate transistor may be used. As a material of a semiconductor used for the transistors, for example, a semiconductor material such as silicon or germanium or an oxide semiconductor material containing at least one of indium, gallium, and zinc may be used. Furthermore, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used because deterioration of the transistor characteristics can be suppressed.

In FIG. 7A, a bottom-gate structure is given as an example of a structure of the transistors. Here, a semiconductor layer is placed at an inner region than a gate electrode layer of the transistor. With such a structure, variation in electric characteristics of the transistor, which is caused by light irradiation, can be suppressed because, when light is emitted from the first substrate 211 side, the semiconductor layer is not directly irradiated with the light owing to the gate electrode layer which shields the light.

A transistor whose structure is different from that of the above transistor will be described below by giving some examples with reference to FIGS. 10A to 10C. The examples given here are bottom-gate transistors.

Figure 10A:
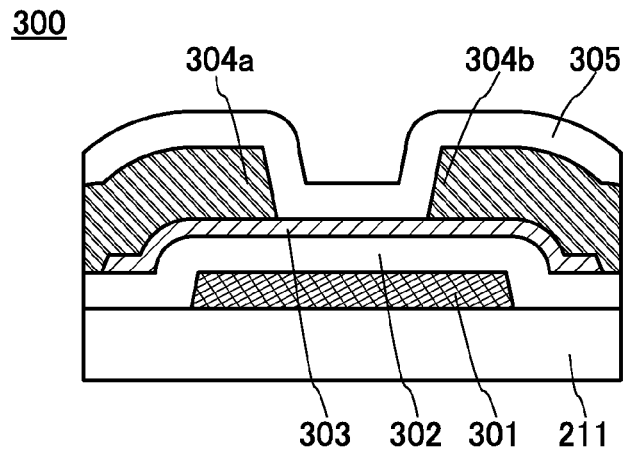
FIGS. 10A to 10C each illustrate a structure example of a transistor according to one embodiment of the present invention.

FIG. 10A is a schematic cross-sectional view of a bottom-gate transistor 300.

The transistor 300 includes a gate electrode layer 301, a gate insulating layer 302 covering the gate electrode layer 301, a semiconductor layer 303 which is overlapped with the gate electrode layer 301 with the gate insulating layer 302 provided therebetween, and a source electrode layer 304a and a drain electrode layer 304b which are electrically connected to the semiconductor layer 303. An insulating layer 305 is provided to cover the transistor 300.

Here, in the transistor 300, the source electrode layer 304a and the drain electrode layer 304b partly cover the top surface and the side surfaces of the semiconductor layer 303. Part of the top surface of the semiconductor layer 303 might be etched in some cases when the source electrode layer 304a and the drain electrode layer 304b are processed by etching.

Note that regions of the semiconductor layer 303, which are in contact with the source electrode layer 304a and the drain electrode layer 304b, may have lower resistance by doping impurities or the like. In the case where silicon is used as a semiconductor, a silicide of metal may be formed. By reducing the resistance of the regions of the semiconductor layer 303, which are in contact with the source electrode layer 304a and the drain electrode layer 304b, contact resistances between the source electrode layer 304a and the drain electrode layer 304b, and the semiconductor layer 303 can be reduced. The resistance of a portion between the source electrode layer 304a and the drain electrode layer 304b can be reduced; therefore, transistor characteristics such as on-state current can be improved, which is preferable.

The number of photomasks needed to form the transistor 300 having such a structure can be reduced; therefore, the manufacturing process can be simplified.

Figure 10B:
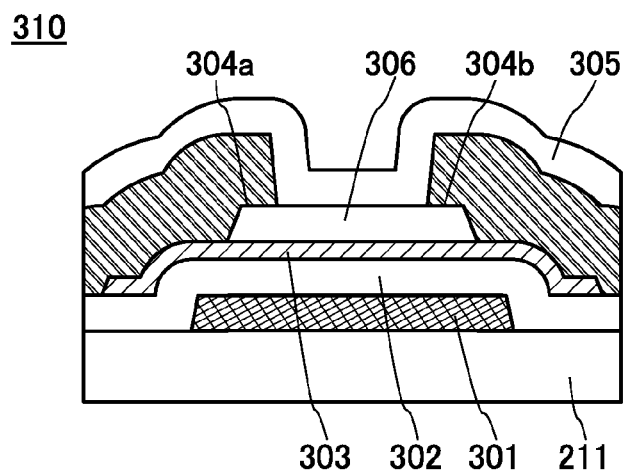

A transistor 310 illustrated in FIG. 10B is different from the transistor 300 illustrated in FIG. 10A in that an insulating layer 306 is formed over the semiconductor layer 303.

The insulating layer 306 is provided to protect the semiconductor layer 303 when the source electrode layer 304a and the drain electrode layer 304b are processed by etching. By providing the insulating layer 306, at least a top surface of a region of the semiconductor layer 303, where a channel is formed, is not exposed after the formation step of the insulating layer 306; therefore, the influence of contamination (metal contamination or organic contamination) caused in subsequent steps can be eliminated, resulting in a highly reliable transistor.

Figure 10C:
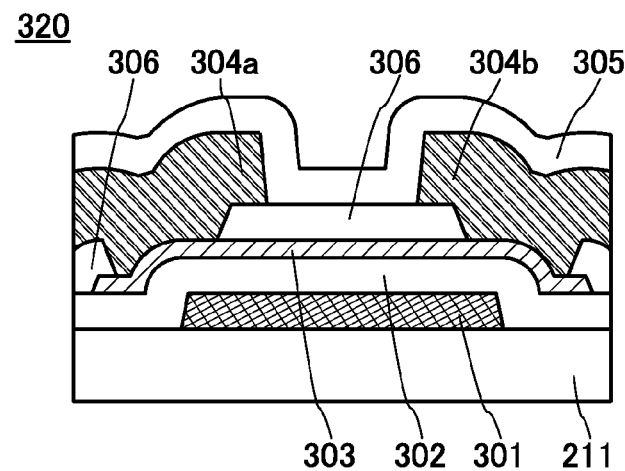

A transistor 320 illustrated in FIG. 10C is different from the transistor 310 illustrated in FIG. 10B in that the insulating layer 306 is further formed over the semiconductor layer 303 in regions where openings for electrically connecting the source electrode layer 304a and the drain electrode layer 304b to the semiconductor layer 303 are not formed.

The source electrode layer 304a and the drain electrode layer 304b are each electrically connected to the semiconductor layer 303 through the openings provided in the insulating layer 306.

As illustrated in FIG. 10C, the end portion of the semiconductor layer 303 is covered with the insulating layer 306 to avoid the exposure of the semiconductor layer 303 other than the openings so that the influence of contamination caused in subsequent steps can be effectively suppressed. Accordingly, a highly reliable transistor can be obtained.

The above is the description of the structure examples of the transistor.

As an example of the display portion 201, FIG. 7A illustrates a cross-sectional structure of the display element 101 and the transmissive portion 103 in one pixel 110. The regions including the driver transistors 221b are illustrated in the display element 101 and the transmissive portion 103.

The display element 101 includes the light-emitting element 111 in which the EL layer 115 and the second electrode layer 117 are sequentially stacked over the first electrode layer 113. The first electrode layer 113 is electrically connected to the one electrode (the source electrode or drain electrode) of the driver transistor 221b through an opening provided in an insulating layer 237 and an insulating layer 238 which will be described later.

The transmissive portion 103 includes the transmissive light-emitting element 131 in which the EL layer 115 and the second electrode layer 117 are sequentially stacked over the third electrode layer 133. The third electrode layer 133 is electrically connected to the one electrode (the source electrode or drain electrode) of the driver transistor 221b in a manner similar to that of the first electrode layer 113.

As a material that can be used for the first electrode layer 113 having a reflective property, a metal material such as titanium, aluminum, gold, platinum, nickel, tungsten, chromium, molybdenum, cobalt, copper, or palladium; or an alloy material containing any of these metal materials can be used. Alternatively, lanthanum, neodymium, silicon, germanium, or the like may be added to the above metal material or alloy material. As an example of the alloy material, any of the following can be given: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, when a metal film or a metal oxide film is stacked to be in contact with a film containing aluminum, oxidation of the film containing aluminum can be suppressed. As examples of the metal material or the metal oxide material in contact with the film containing aluminum, titanium and titanium oxide can be given. Alternatively, the first electrode layer 113 may be a stack of the film containing the above metal materials and a film containing a light-transmitting material which will be described later. For example, a stacked film of silver and indium tin oxide or a stacked film of indium tin oxide and an alloy of silver and magnesium can be used.

Note that in the case where any of the above materials is used for the second electrode layer 117 having a light-transmitting property and a reflective property, a conductive film containing any of the above materials is formed thin so as to be able to transmit light.

On the other hand, as a conductive material that can be used for the second electrode layer 117 and the third electrode layer 133 having light-transmitting properties, graphene or a conductive oxide such as indium oxide, indium tin oxide, indium zinc oxide, zinc oxide, or zinc oxide to which gallium is added can be used. As the above conductive material, a metal material such as gold, silver, platinum, magnesium, nickel, tungsten, chromium, molybdenum, iron, cobalt, copper, palladium, or titanium; or an alloy material containing any of these metal materials can be used. Further, a nitride of these metal materials (e.g., titanium nitride) or the like may be used. In the case of using the metal material (or the nitride of the metal material), a conductive film containing any of the above materials is formed thin so as to be able to transmit light. Alternatively, a stacked film of any of the above materials can be used as the conductive film. For example, a stacked film of indium tin oxide and an alloy of silver and magnesium is preferably used because the conductivity can be increased.

The above conductive films can be formed by a deposition method such as a sputtering method or an evaporation method, a printing method such as an ink-jet method or a screen printing method, or a plating method.

Note that when the above conductive oxide film having a light-transmitting property is formed by a sputtering method, the use of a deposition atmosphere containing argon and oxygen allows the light-transmitting property to be increased.

Further, in the case where the conductive oxide film is formed over the EL layer, it is preferable that a first conductive oxide film formed under an atmosphere containing argon with a reduced oxygen concentration and a second conductive oxide film formed under an atmosphere containing argon and oxygen because film formation damage to the EL layer can be reduced. Here, when the first conductive oxide film is formed, the purity of an argon gas is preferably high, and for example, it is preferable to use the argon gas whose dew point is lower than or equal to −70° C., more preferably lower than or equal to −100° C.

An insulating layer 233 is provided so as to cover an end portion of the first electrode layer 113 or the third electrode layer 133. Moreover, an upper end portion or a lower end portion of the insulating layer 233 preferably has a curved surface with a radius of curvature of 0.2 µm to 3 µm in order to be adequately covered with the second electrode layer 117 which is formed over the insulating layer 233. As a material of the insulating layer 233, an organic compound such as a negative photosensitive resin or a positive photosensitive resin whose solubility in an etchant changes by irradiation with light, or an inorganic compound such as silicon oxide or silicon oxynitride can be used.

The insulating layer 238 functions as a planarization layer for suppressing the influence of an uneven shape due to the transistors provided therebelow. A short circuit or the like of the light-emitting element 111 and the transmissive light-emitting element 131 can be suppressed by providing the insulating layer 238. The insulating layer 238 can be formed using an organic compound such as an organic resin.

An insulating layer 234 is provided over a surface of the first substrate 211. The insulating layer 234 reduces diffusion of impurities included in the first substrate 211. An insulating layer 235 and an insulating layer 236 which are in contact with a semiconductor layer in the transistors, and the insulating layer 237 which covers the transistors preferably reduce diffusion of impurities into the semiconductor included in the transistors. For these insulating layers, for example, a semiconductor such as silicon, or an oxide or a nitride of metal such as aluminum can be used. Alternatively, a stacked film of such an inorganic insulating material or a stacked film of such an inorganic insulating material and an organic insulating material may be used. Note that the insulating layer 234 is not necessarily provided when not needed.

The second substrate 212 is provided with the color filter 105 which is overlapped with the light-emitting element 111. The color filter 105 can be formed using an organic resin that transmits red light, green light, or blue (or yellow) light.

Further, a black matrix 241 is provided between the adjacent display elements 101 or between the display element 101 and the transmissive portion 103. The black matrix 241 shields light emitted from the adjacent light-emitting elements 111 or the transmissive light-emitting element 131, thereby preventing color mixture. Here, the color filter 105 is provided so that its end portion overlaps with the black matrix 241, whereby light leakage can be reduced. The black matrix 241 can be formed using a material such as a metal or an organic resin including a pigment. Note that the black matrix 241 may be provided in a region other than the display portion 201 (e.g., the scan line driver circuit 202); a region which does not transmit light (e.g., a region overlapped with a wiring); or the like.

An overcoat 242 is formed to cover the color filter 105 and the black matrix 241. The overcoat 242 is formed using a material that transmits light emitted from the light-emitting element 111 and/or the transmissive light-emitting element 131, and can be formed using, for example, an inorganic insulating film or an organic insulating film. Note that the overcoat 242 is not necessarily provided when not needed.

Although the schematic cross-sectional view in FIG. 7A illustrates only one display element 101 and one transmissive portion 103, a display device capable of full-color display can be obtained by providing, in the display portion 201, the display elements 101 that can emit light of three colors (R, G, and B) or four colors (R, G, B, and Y).

The first substrate 211 and the second substrate 212 are bonded to each other with the sealant 213 at the outer edge portion of the second substrate 212. As the sealant 213, an organic resin such as a thermosetting resin or a photocurable resin, a glass material including low-melting glass, or the like can be used. Such a glass material is preferable because of its high barrier property against impurities such as water and oxygen. In the case where the glass material is used as the sealant 213, a layer in contact with the glass material is preferably formed using an inorganic insulator, for example, an oxide of a semiconductor such as silicon oxide or a metal oxide such as aluminum oxide because adhesion between the first substrate 211 and the second substrate 212 can be improved.

The light-emitting element 111 and the transmissive light-emitting element 131 are provided in the sealed region surrounded by the first substrate 211, the second substrate 212, and the sealant 213. The sealed region may be filled with an inert gas such as a rare gas or a nitrogen gas, a solid such as an organic resin, or a viscous material such as a gel, or may be placed in a reduced pressure atmosphere. It is preferable that impurities such as water and oxygen in the sealed region be small because the reliability of the light-emitting element 111 and the transmissive light-emitting element 131 is improved.

Further, when an insulating film covering the light-emitting element 111 and the transmissive light-emitting element 131 are provided, the light-emitting element 111 and the transmissive light-emitting element 131 are not exposed, thereby improving the reliability thereof. As the insulating film, a material which does not penetrate impurities such as water and oxygen is used. For example, an inorganic insulating film such as a film of an oxide or a nitride of silicon or aluminum is preferably used.

Furthermore, a drying agent may be provided in a region in the sealed region, which is not overlapped with the transmissive portion 103 and the light-emitting element 111. For example, for the drying agent, a substance which absorbs moisture by chemical adsorption, such as an oxide of an alkaline earth metal (e.g., calcium oxide or barium oxide), can be used. Alternatively, a substance which adsorbs impurities such as moisture by physical adsorption, such as zeolite or silica gel, may be used. The drying agent is provided in the sealed region, whereby impurities such as moisture can be reduced and the reliability of the light-emitting element 111 and the transmissive light-emitting element 131 can be improved.

The above is the description of the display device having the display portion in which a top-emission type light-emitting element is used for the display element provided in the pixel.

Structure Example 2

In this structure example, an example of a display device having a display portion in which a bottom-emission type light-emitting element is used for a display element provided in a pixel will be described. Note that description of portions which are already described in Structure Example 1 will be omitted or simply given.

FIG. 7B is a schematic cross-sectional view of a display device 250. The display device 250 is different from the display device 200 described in Structure Example 1 in the structures of the display element 101 and the transmissive portion 103.

A light-emitting element 111 in the display element 101 is a bottom-emission type light-emitting element that emits light toward the first substrate 211 side where the elements are provided.

In the light-emitting element 111, the EL layer 115, the third electrode layer 133, and the first electrode layer 113 are stacked over the second electrode layer 117. Here, the second electrode layer 117 has at least a light-transmitting property with respect to visible light, and the first electrode layer 113 has a reflective property with respect to visible light. Therefore, light is emitted from the light-emitting element 111 toward the first substrate 211 side.

In a transmissive light-emitting element 131, the EL layer 115 and the third electrode layer 133 are stacked over the second electrode layer 117. Here, the third electrode layer 133 has a light-transmitting property with respect to visible light. Therefore, light is emitted from the transmissive light-emitting element 131 toward both the first substrate 211 side and the second substrate 212 side. Further, the transmissive light-emitting element 131 can transmit visible light.

Here, as illustrated in FIG. 7B, the third electrode layer 133 for forming the transmissive light-emitting element 131 can be provided in contact with the first electrode layer 113 for forming the light-emitting element 111. Note that although, in FIG. 7B, the first electrode layer 113 is provided over the third electrode layer 133 in the light-emitting element 111, the third electrode layer 133 may be provided so as to cover the first electrode layer 113 by employing a reverse stack order.

Further, the color filter 105 is provided over the insulating layer 237 covering transistors to overlap with the light-emitting element 111. Furthermore, the insulating layer 238 covering the color filter 105 is formed.

The above is the description of the display device having the display portion in which a bottom-emission type light-emitting element is used for the display element provided in the pixel.

This embodiment can be combined with any of the other embodiments disclosed in this specification as appropriate.

Embodiment 3

In this embodiment, examples of EL layers that can be applied to one embodiment of the present invention will be described with reference to FIGS. 8A to 8C.

Figure 8A:
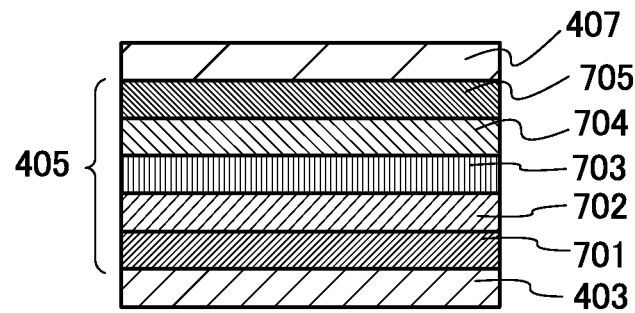
FIGS. 8A to 8C each illustrate an EL layer according to one embodiment of the present invention.

An EL layer 405 illustrated in FIG. 8A is provided between a first electrode 403 and a second electrode 407. For the first electrode 403, a structure similar to that of the first electrode layer 113 or the third electrode layer 133 which is described in the above embodiments as an example can be employed, and for the second electrode 407, a structure similar to that of the second electrode layer 117 which is described in the above embodiments as an example can be employed.

A light-emitting element including the EL layer 405 described in this embodiment as an example can be used in any of the display devices described in the above embodiments as examples.

The EL layer 405 needs to include at least a light-emitting layer containing a light-emitting organic compound. In addition, the EL layer 405 can have a layered structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In the EL layer 405 of this embodiment, a hole-injection layer 701, a hole-transport layer 702, a layer 703 containing a light-emitting organic compound, an electron-transport layer 704, and an electron-injection layer 705 are stacked in this order over the first electrode 403. Note that the stack order may be reversed.

A method for forming the light-emitting element illustrated in FIG. 8A will be described.

The hole-injection layer 701 is a layer containing a substance having a high hole-injection property. As the substance having a high hole-injection property, for example, metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: H$_2$Pc), or copper(II) phthalocyanine (abbreviation: CuPc) can also be used.

In addition, for example, an aromatic amine compound which is a low molecular-weight organic compound can be used.

Further alternatively, any of polymeric compounds (including an oligomer, a dendrimer, and a polymer) can be used. A polymer to which acid is added can be used.

In particular, for the hole-injection layer 701, a composite material in which an acceptor substance is mixed with an organic compound having a high hole-transport property is preferably used. The use of the composite material in which an acceptor substance is mixed with a substance having a high hole-transport property allows efficient hole injection from the first electrode 403, and reduction in driving voltage of the light-emitting element. Such a composite material can be formed by co-evaporation of a substance having a high hole-transport property and an acceptor substance (an electron acceptor). By using the composite material for the hole-injection layer 701, holes can be easily injected from the first electrode 403 to the EL layer 405.

As the organic compound for the composite material, an organic compound having a high hole-transport property. Specifically, a substance having a hole mobility of $10^{-6}$ cm$^2$/Vs or higher is preferably used. Note that other substances may also be used as long as their hole-transport property is higher than their electron-transport property.

More specifically, an aromatic amine compound, a carbazole derivative, an aromatic hydrocarbon compound, a polymeric compound, and the like can be used.

Examples of the acceptor substance include an organic compound and transition metal oxide. For example, oxides of metals belonging to Groups 4 to 8 in the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting property. Among these metal oxides, molybdenum oxide is particularly preferable because of its stability in the air, low hygroscopic property, and easiness to be treated.

The composite material may be formed using the above electron acceptor and a polymeric compound and used for the hole-injection layer 701.

The hole-transport layer 702 is a layer containing a substance having a high hole-transport property. As the substance having a high hole-transport property, for example, an aromatic amine compound can be used. The substance is mainly one that has a hole mobility of $10^{-6}$ cm$^2$/Vs or higher. Note that other substances may also be used as long as their hole-transport property is higher than their electron-transport property. The layer containing a substance having a high hole-transport property is not limited to a single layer, and two or more layers containing the above substances may be stacked.

In addition, a carbazole derivative, an anthracene derivative, or a polymeric compound having a high hole-transport property may also be used for the hole-transport layer 702.

For the layer 703 containing a light-emitting organic compound, a fluorescent compound which exhibits fluorescence or a phosphorescent compound which exhibits phosphorescence can be used.

Note that the layer 703 containing a light-emitting organic compound may have a structure in which any of the above light-emitting organic compounds (guest material) is dispersed in another substance (host material). Various kinds of materials can be used as the host material, and it is preferable to use a substance which has a lowest unoccupied molecular orbital level (LUMO level) higher than that of the light-emitting substance and has a highest occupied molecular orbital level (HOMO level) lower than that of the light-emitting substance.

Alternatively, as the host material, plural kinds of materials can be used. For example, in order to suppress crystallization, a substance which suppresses crystallization may be further added. In addition, a different kind of substance may be further added in order to efficiently transfer energy to the guest material.

When a structure in which a guest material is dispersed in a host material is employed, crystallization of the layer 703 containing a light-emitting organic compound can be suppressed. Further, concentration quenching due to high concentration of the guest material can be suppressed.

A polymeric compound can be used for the layer 703 containing a light-emitting organic compound.

Further, by providing a plurality of layers each containing a light-emitting organic compound with different emission color, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that the word "complementary" means color relationship in which an achromatic color is obtained when colors are mixed. That is, white light emission can be obtained by mixture of light from substances whose emission colors are complementary colors. This can be applied to a light-emitting element including three or more layers each containing a light-emitting organic compound.

The electron-transport layer 704 is a layer containing a substance having a high electron-transport property. The substance having a high electron-transport property is mainly one that have an electron mobility of $10^{-6}$ cm$^2$/Vs or higher. The electron-transport layer is not limited to a single layer, and two or more layers containing the above substances may be stacked.

The electron-injection layer 705 is a layer containing a substance having a high electron-injection property. For the electron-injection layer 705, an alkali metal, an alkaline earth metal, or a compound thereof (e.g., lithium, cesium, calcium, lithium fluoride, cesium fluoride, calcium fluoride, or lithium oxide) can be used. In addition, a rare earth metal compound such as erbium fluoride can also be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an ink-jet method, or a coating method.

Figure 8B:
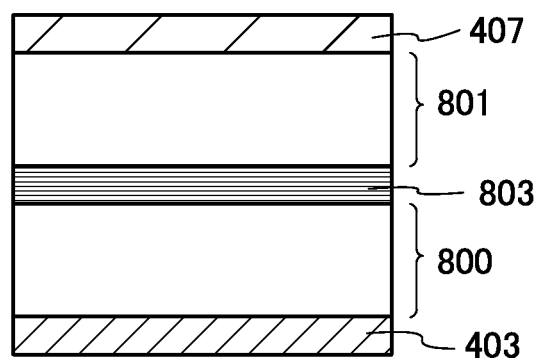

As illustrated in FIG. 8B, a plurality of EL layers may be stacked between the first electrode 403 and the second electrode 407. In this case, a charge generation layer 803 is preferably provided between a first EL layer 800 and a second EL layer 801 which are stacked. The charge generation layer 803 can be formed by using the above composite material. Further, the charge generation layer 803 may have a layered structure including a layer containing the composite material and a layer containing another material. In this case, as the layer including another material, a layer including a substance having an electron-donating property (a donor substance) and a substance having a high electron-transport property, a layer formed of a transparent conductive film, or the like can be used. As for a light-emitting element having such a structure, problems such as energy transfer and quenching hardly occur, and a light-emitting element which has both high emission efficiency and long lifetime can be easily obtained due to expansion in the choice of materials. Moreover, a light-emitting element which provides phosphorescence from one of the EL layers and fluorescence from the other of the EL layers can be easily obtained. Note that this structure can be combined with the above structure of the EL layer.

Further, by making the emission colors of the EL layers different, light emission of a desired color can be obtained from the light-emitting element as a whole. For example, in a light-emitting element including two EL layers, the emission color of a first EL layer and the emission color of a second EL layer are made complementary, so that the light-emitting element as a whole can emit white light. This can be applied to a light-emitting element having three or more EL layers.

In order to obtain white light with favorable color rendering properties, light whose emission spectrum covers the whole visible light band is needed and thus a light-emitting element in which three or more EL layers are stacked is preferably used. For example, such a light-emitting element can be formed by stacking EL layers emitting red light, blue light, and green light. In this manner, the color rendering properties of a light-emitting element can be improved by stacking EL layers of different three or more colors.

An optical adjustment layer may be formed between the first electrode 403 and the second electrode 407. The optical adjustment layer is a layer for adjusting the optical distance between an electrode having a reflective property and an electrode having a light-transmitting property. With the optical adjustment layer, emission intensity of light in a specific wavelength band can be intensified and, as a result, the color tone can be adjusted.

Figure 8C:
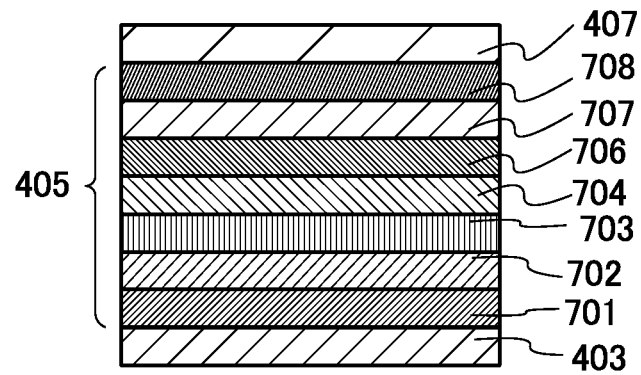

As illustrated in FIG. 8C, an EL layer 405 may include, between the first electrode 403 and the second electrode 407, the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the second electrode 407.

It is preferable to provide the composite material layer 708 which is in contact with the second electrode 407 because damage caused to the EL layer 405 can be reduced particularly when the second electrode 407 is formed by a sputtering method. The composite material layer 708 can be formed using the above composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

Any of the following substances having a high electron injection property can be used for the electron-injection buffer layer 706: an alkali metal, an alkaline earth metal, a rare earth metal, a compound thereof (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)), and the like.

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound thereof (e.g., an alkali metal compound (including an oxide such as lithium oxide, a halide, and carbonate such as lithium carbonate or cesium carbonate), an alkaline earth metal compound (including an oxide, a halide, and carbonate), and a rare earth metal compound (including an oxide, a halide, and carbonate)). Note that as the substance having a high electron-transport property, a material similar to the material for the electron-transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Accordingly, an increase in the driving voltage can be prevented.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property contained in the electron-transport layer 704. As a specific value of the energy level, the LUMO level of the substance having a high electron-transport property contained in the electron-relay layer 707 is greater than or equal to −5.0 eV, preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the metal complex having a metal-oxygen bond and an aromatic ligand, which is contained in the electron-relay layer 707, a metal complex having a metal-oxygen double bond is preferably used. The metal-oxygen double bond has acceptor properties (properties of easily accepting electrons); thus, electrons can be transferred (donated and accepted) more easily. Further, the metal complex which has a metal-oxygen double bond is considered stable. Thus, the use of the metal complex having the metal-oxygen double bond makes it possible to drive the light-emitting element at low voltage more stably.

As a metal complex having a metal-oxygen bond and an aromatic ligand, a phthalocyanine-based material is preferable. In particular, a substance having a molecular structure whose metal-oxygen double bond readily interacts with another molecular is preferably used because of its high acceptor property.

Note that as the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent. For that reason, such a phthalocyanine derivative has an advantage of being easily handled during formation of a light-emitting element. Owing to the solubility in a solvent, such a phthalocyanine derivative also has an advantage of facilitating maintenance of an apparatus used for film formation.

The electron-relay layer 707 may further contain a donor substance. Note that as the donor substance, an organic compound such as tetrathianaphthacene (abbreviation: TTN), nickelocene, or decamethylnickelocene can be used as well as an alkali metal, an alkaline earth metal, a rare earth metal, a compound thereof (e.g., an alkali metal compound (including an oxide such as lithium oxide, a halide, and carbonate such as lithium carbonate or cesium carbonate), an alkaline earth metal compound (including an oxide, a halide, and carbonate), and a rare earth metal compound (including an oxide, a halide, and carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level higher than the acceptor level of the acceptor substance contained in the composite material layer 708 can be used. As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron-relay layer 707 because of its stability.

Note that in the case where a donor substance is contained in the electron-relay layer 707, the electron-relay layer 707 can be formed by a method such as co-evaporation of the substance having a high electron-transport property and the donor substance.

The hole-injection layer 701, the hole-transport layer 702, the layer 703 containing a light-emitting organic compound, and the electron-transport layer 704 may each be formed using any of the above materials.

In the above manner, the EL layer 405 in this embodiment can be formed.

This embodiment can be combined with any of the other embodiments disclosed in this specification as appropriate.

Embodiment 4

An application example of the display device according to one embodiment of the present invention will be described in this embodiment with reference to FIGS. 9A to 9D.

A transmissive display device according to one embodiment of the present invention can be applied to various electronic devices such as windshields on vehicles, windows of architectural structures such as houses and buildings, and glass for show windows and showcases of stores; mobile information terminals such cellular phones and tablet terminals; wearable displays such as head mounted displays; portable game machines, audio reproducing devices, and viewfinders of digital cameras and digital video cameras; or head-up displays used for planes, vehicles, and the like. Some of the usages will be described below with reference to drawings.

Figure 9A:
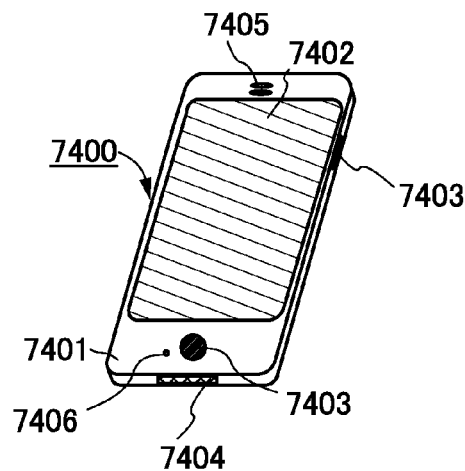
FIGS. 9A to 9D each illustrate an application examples of a display device according to one embodiment of the present invention.

FIG. 9A illustrates an example of a cellular phone. A cellular phone 7400 is provided with a display portion 7402 incorporated in a housing 7401, an operation button 7403, an external connection port 7404, a speaker 7405, a microphone 7406, and the like. The cellular phone 7400 is fabricated using the display device for the display portion 7402.

When the display portion 7402 of the cellular phone 7400 illustrated in FIG. 9A is touched with a finger or the like, data can be input into the cellular phone 7400. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or creating an e-mail, a text input mode mainly for inputting text is selected for the display portion 7402 so that text displayed on a screen can be input. In this case, it is preferable to display a keyboard or number buttons on almost all the area of the screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are switched by touching the display portion 7402 or operating the operation button 7403 of the housing 7401. Alternatively, the screen modes can be switched depending on kinds of images displayed on the display portion 7402. For example, when a signal for an image displayed on the display portion is data of moving images, the screen mode is switched to the display mode. When the signal is text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 9C:
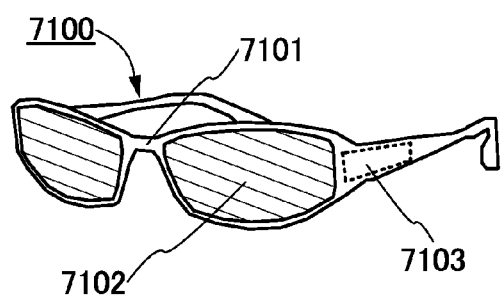
Figure 9B:
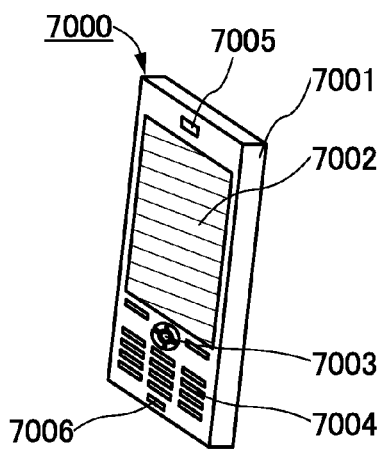

FIG. 9B illustrates an example of a cellular phone having a structure which is different from the structure of the cellular phone 7400 in FIG. 9A.

A cellular phone 7000 illustrated in FIG. 9B greatly differs from the cellular phone 7400 in that it includes a plurality of input means such as operation buttons 7003 and numerical keypads 7004.

The cellular phone 7000 is provided with a display portion 7002 incorporated in a housing 7001, the operation buttons 7003, the numerical keypads 7004, a speaker 7005, and a microphone 7006. The cellular phone 7000 is fabricated using the display device for the display portion 7002.

When the operation buttons 7003, the numerical keypads 7004, or the like of the cellular phone 7000 illustrated in FIG. 9B is operated, data can be input into the cellular phone 7000. Further, operations such as making a call and creating e-mail can be performed by operating the operation buttons 7003 and the numerical keypads 7004.

In a manner similar to that of the cellular phone 7400, the cellular phone 7000 can be operated by touching the display portion 7002. The cellular phone 7000 has a preferable structure because it can be operated with a plurality of operation buttons 7003 and the numerical keypads 7004 in addition to touch on the display portion 7002 as described above, which allows a user to select a way which is easier to operate depending on the situation.

Since the transmissive display device is used for the cellular phone 7000, the cellular phone 7000 has an advantage in that, with the operation buttons 7003 and the numerical keypads 7004, there is no need to directly touch the display portion 7002 with a finger or the like, which allows an image of an object that is seen through the display portion 7002 to be displayed without being obstructed by a finger or the like.

FIG. 9C illustrates an example of a head mounted display. A head mounted display 7100 illustrated in FIG. 9C includes a display portion 7102 which is fixed to a frame 7101 and a control portion 7103 incorporated in the frame 7101. Note that the head mounted display 7100 is fabricated by using the display device for the display portion 7102.

The control portion 7103 can generate and transmit an image signal or the like to the display portion 7102, so that an image can be displayed on the display portion 7102.

Alternatively, an optical sensor such as an infrared ray sensor or a UV sensor, an antenna, or the like may be provided in the control portion 7103 to receive a signal generated by reception of an infrared ray, an ultra violet ray, or an electric wave, so that an image may be displayed on the display portion 7102 in accordance with the signal.

Further alternatively, the control portion 7103 may be provided with a power storage device. In that case, it is preferable that charging can be performed without contact.

Note that a controller provided with a power storage device, one of functions of the control portion 7103, and the like may be additionally included, in which case a signal is transmitted to the head mounted display 7100 from the controller. Wired or wireless transmission of a signal or power from the controller to the head mounted display 7100 is performed.

Figure 9D:
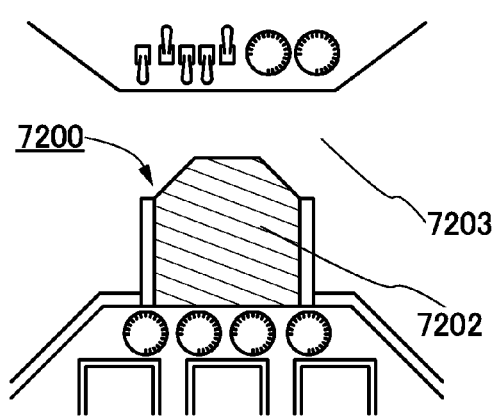

FIG. 9D illustrates an example of a head-up display mounted on a plane.

A head-up display 7200 includes a display portion 7202, which is provided to face a cockpit windshield 7203 of a plane.

On the head-up display 7200, for example, data on an altitude, a speed, a direction, an ambient temperature, an air pressure, a horizontal axis, or a vertical axis are displayed (displayed image). In addition, data on a target, for example, a distance to the target can also be displayed on the head-up display 7200 so as to be superimposed on an actual image (transmitted image) of the target that is seen through the head-up display 7200.

By providing the head-up display 7200, various data can be obtained within the same field of vision.

Further, the viewing angle of the head-up display 7200 may be narrowed so that the displayed image is not viewed from the position other than a regular seat of a pilot. As described above, in the case of using the head-up display 7200 by superimposing the transmitted image and the displayed image on each other, if the displayed image can be viewed from an irregular position, misidentification of the data occurs due to the deviation in position of the displayed image and the transmitted image; therefore, it is effective to narrow the viewing angle.

It is needless to say that one embodiment of the present invention is not limited to the electronic devices illustrated in FIGS. 9A to 9D as long as the display device described in any of the above embodiments is included.

The display device according to one embodiment of the present invention can be applied to such an electronic device. Therefore, the electronic device can have a transmissive display portion with high display quality. In addition, the transmissive display portion in the electronic device can be driven with low power consumption.

This embodiment can be combined with any of the other embodiments disclosed in this specification as appropriate.

This application is based on Japanese Patent Application serial No. 2011-242020 filed with the Japan Patent Office on Nov. 4, 2011, the entire contents of which are hereby incorporated by reference.

What is claimed is:

1. A display device comprising:
    a scan line driver circuit;
    a signal line driver circuit; and
    a display portion comprising a pixel, the pixel comprising:
    a first region comprising a first display element;
    a second region neighboring the first region, the second region comprising a transmissive light-emitting element;
    a first wiring interposed between the first region and the second region, the first wiring being electrically connected to the signal line driver circuit; and
    a second wiring electrically connected to the scan line driver circuit,
    wherein the first region and the second region are arranged in a direction parallel to the second wiring,
    wherein the first display element comprises:
    an EL layer interposed between a first electrode and a second electrode;
    a first transistor directly connected to the second wiring; and
    a first color filter which overlaps with the EL layer, the first electrode, and the second electrode,
    wherein the second wiring is a single wiring,
    wherein one of the first electrode and the second electrode has a light-transmitting property, and the other of the first electrode and the second electrode does not have a light-transmitting property,
    wherein the transmissive light-emitting element comprises:
    the EL layer interposed between a pair of electrodes, both of the pair of electrodes having a light-transmitting property; and
    a second transistor directly connected to the first wiring and the second wiring, where the second region is configured to transmit external light through the pair of electrodes and the EL layer interposed therebetween.

2. The display device according to claim 1, wherein emission from the transmissive light-emitting element is extracted outside the display device without filtering by the first color filter.

3. The display device according to claim 1, wherein the EL layer is configured to emit white light.

4. The display device according to claim 1, wherein an area of the transmissive light-emitting element is larger than an area of the first display element.

5. The display device according to claim 1, wherein an area of the second region is larger than an area of the first region.

6. An electric device comprising the display device according to claim 1.

7. A method for driving the display device according to claim 1, the method comprising:
    a first mode for displaying an image by driving both the first display element and the transmissive light-emitting element; and
    a second mode for displaying an image by driving only the first display element.

8. The display device according to claim 1,
    wherein the first wiring is interposed between one of the first electrode and the second electrode which is electrically connected to the first transistor and one of the pair of electrodes.

9. The display device according to claim 1, wherein the first region further comprises a second display element and third display element, the second display element comprises:
    the EL layer interposed between the second electrode and a third electrode;
    a third transistor electrically connected to the second wiring; and
    a second color filter which overlaps with the EL layer, the second electrode, and the third electrode, wherein one of the second electrode and the third electrode has a light-transmitting property, and the other of the second electrode and the third electrode does not have a light-transmitting property, the third display element comprises:

the EL layer interposed between the second electrode and a fourth electrode;

a fourth transistor electrically connected to the second wiring; and a third color filter which overlaps with the EL layer, the second electrode, and the fourth electrode, wherein one of the second electrode and the fourth electrode has a light-transmitting property, and the other of the second electrode and the fourth electrode does not have a light-transmitting property, wherein the second display element is between the first display element and the third display element, and wherein the first display element is between the second display element and the transmissive light-emitting element.

10. The display device according to claim 1, wherein the second wiring overlaps with the first region and the second region.

11. A display device comprising:

a scan line driver circuit;

a signal line driver circuit; and a display portion comprising a pixel, the pixel comprising:

a first region comprising a first display element;

a second region neighboring the first region, the second region comprising a transmissive light-emitting element;

a first wiring interposed between the first region and the second region, the first wiring being electrically connected to the signal line driver circuit; and a second wiring electrically connected to the scan line driver circuit, wherein the second wiring is a single wiring, wherein the first region and the second region are arranged in a direction parallel to the second wiring, wherein the first display element comprises:

a first transistor directly connected to the second wiring;

a first electrode electrically connected to the first transistor;

an EL layer over the first electrode;

a second electrode over the EL layer; and a first color filter over the second electrode, wherein the first display element is arranged so that emission from the EL layer is extracted only through the second electrode, wherein the transmissive light-emitting element comprises:

a second transistor directly connected to the first wiring and the second wiring;

a third electrode electrically connected to the second transistor;

the EL layer over the third electrode; and the second electrode over the EL layer so that the second electrode is shared by the first display element and the transmissive light-emitting element, wherein the second region is configured to transmit external light through the second electrode, the third electrode, and the EL layer interposed therebetween.

12. The display device according to claim 11, wherein emission from the transmissive light-emitting element is extracted outside the display device without filtering by the first color filter.

13. The display device according to claim 11, wherein the EL layer is configured to emit white light.

14. The display device according to claim 11, wherein an area of the transmissive light-emitting element is larger than an area of the first display element.

15. The display device according to claim 11, wherein an area of the second region is larger than an area of the first region.

16. An electric device comprising the display device according to claim 11.

17. A method for driving the display device according to claim 11, the method comprising:

a first mode for displaying an image by driving both the first display element and the transmissive light-emitting element; and a second mode for displaying an image by driving only the first display element.

18. The display device according to claim 11, wherein the first wiring is interposed between the first electrode and the third electrode.

19. The display device according to claim 11, wherein the first region further comprises a second display element and third display element, the second display element comprises:

a third transistor electrically connected to the second wiring;

a fourth electrode electrically connected to the third transistor;

the EL layer over the fourth electrode;

the second electrode over the EL layer; and a second color filter over the second electrode, wherein the second display element is arranged so that emission from the EL layer is extracted only through the second electrode, the third display element comprises:

a fourth transistor electrically connected to the second wiring;

a fifth electrode electrically connected to the fourth transistor;

the EL layer over the fifth electrode;

the second electrode over the EL layer; and a third color filter over the second electrode, wherein the third display element is arranged so that emission from the EL layer is extracted only through the second electrode, wherein the second display element is between the first display element and the third display element, and wherein the first display element is between the second display element and the transmissive light-emitting element.

20. The display device according to claim 11, wherein the second wiring overlaps with the first region and the second region.

21. A display device comprising:

a scan line driver circuit;

a signal line driver circuit; and a display portion comprising a pixel, the pixel comprising:

a first region comprising a first display element;

a second region neighboring the first region, the second region comprising a transmissive light-emitting element;

a first wiring interposed between the first region and the second region, the first wiring being electrically connected to the signal line driver circuit and a second wiring electrically connected to the scan line driver circuit, wherein the second wiring is a single wiring, wherein the first region and the second region are arranged in a direction parallel to the second wiring, wherein the first display element comprises:

a first transistor directly connected to the second wiring;

an insulating layer over the first transistor;

a first color filter over the first transistor;

a first electrode over the first color filter, the first electrode electrically connected to the first transistor;

an EL layer over the first electrode;

a second electrode over the EL layer; and a third electrode over and in direct contact with the second electrode, wherein the first display element is arranged so that emission from the EL layer is extracted only through the first electrode, wherein the transmissive light-emitting element comprises:

a second transistor directly connected to the first wiring and the second wiring;

a fourth electrode electrically connected to the second transistor;

the EL layer over the fourth electrode; and the second electrode over the EL layer so that the second electrode is shared by the first display element and the transmissive light-emitting element, wherein the transmissive light-emitting element is arranged so that the emission from the EL layer is extracted through the second electrode, the fourth electrode, and the EL layer.

22. The display device according to claim 21, wherein emission from the transmissive light-emitting element is extracted outside the display device without filtering by the first color filter.

23. The display device according to claim 21, wherein the EL layer is configured to emit white light.

24. The display device according to claim 21, wherein an area of the transmissive light-emitting element is larger than an area of the first display element.

25. The display device according to claim 21, wherein an area of the second region is larger than an area of the first region.

26. A method for driving the display device according to claim 21, the method comprising:

a first mode for displaying an image by driving both the first display element and the transmissive light-emitting element; and a second mode for displaying an image by driving only the first display element.

27. The display device according to claim 21, wherein the first wiring is interposed between the first electrode and the fourth electrode.

28. The display device according to claim 21, wherein the first region further comprises a second display element and third display element, the second display element comprises:

a third transistor electrically connected to the second wiring;

the insulating layer over the third transistor;

a second color filter over the third transistor;

a fifth electrode over the second color filter, the fifth electrode electrically connected to the third transistor;

the EL layer over the fifth electrode;

the second electrode over the EL layer; and a sixth electrode over and in direct contact with the second electrode, wherein the second display element is arranged so that emission from the EL layer is extracted only through the fifth electrode, the third display element comprises:

a fourth transistor electrically connected to the second wiring;

the insulating layer over the fourth transistor;

a third color filter over the fourth transistor;

a seventh electrode over the third color filter, the seventh electrode electrically connected to the fourth transistor;

the EL layer over the seventh electrode;

the second electrode over the EL layer; and an eighth electrode over and in direct contact with the second electrode, wherein the third display element is arranged so that emission from the EL layer is extracted only through the seventh electrode, wherein the second display element is between the first display element and the third display element, and wherein the first display element is between the second display element and the transmissive light-emitting element.

29. The display device according to claim 21, wherein the second wiring overlaps with the first region and the second region.

* * * * *